(12) United States Patent
Douskey et al.

(10) Patent No.: US 9,201,117 B2
(45) Date of Patent: Dec. 1, 2015

(54) MANAGING REDUNDANCY REPAIR USING BOUNDARY SCANS

(71) Applicant: International Business Machines Corporation, Armonk, NY (US)

(72) Inventors: Steven M. Douskey, Rochester, MN (US); Ryan A. Fitch, Southfield, MI (US); Michael J. Hamilton, Rochester, MN (US); Amanda R. Kaufer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 164 days.

(21) Appl. No.: 13/887,674

(22) Filed: May 6, 2013

(65) Prior Publication Data

US 2014/0331097 A1 Nov. 6, 2014

(51) Int. Cl.
*G01R 31/28* (2006.01)
*G01R 31/3185* (2006.01)

(52) U.S. Cl.
CPC *G01R 31/318544* (2013.01); *G01R 31/318536* (2013.01)

(58) Field of Classification Search
None
See application file for complete search history.

(56) References Cited

U.S. PATENT DOCUMENTS

| | | | |
|---|---|---|---|
| 5,737,497 A * | 4/1998 | Ballard | 706/47 |
| 6,742,150 B1 | 5/2004 | Ghameshlu et al. | |
| 7,055,113 B2 | 5/2006 | Broberg, III et al. | |
| 2007/0226563 A1 * | 9/2007 | Buchner et al. | 714/727 |
| 2009/0091333 A1 * | 4/2009 | Chung et al. | 324/538 |
| 2010/0060310 A1 * | 3/2010 | Laisne et al. | 326/10 |
| 2010/0201377 A1 * | 8/2010 | Arsovski et al. | 324/612 |
| 2013/0159587 A1 * | 6/2013 | Nygren et al. | 710/306 |

FOREIGN PATENT DOCUMENTS

| | | |
|---|---|---|
| JP | 01289269 | 11/1989 |
| JP | 02171613 | 3/1990 |

OTHER PUBLICATIONS

Disclosed Anonymously "An Improved Spare Latch Circuit Design and System", IP.com Prior Art Database. IP.com No. IPCOM000212421D. Electronic Publication Date Nov. 11, 2011, pp. 1-8. Copyright © IP.com.

IBM TDB, "Spare I/O Preparation for Use at Release Interface Tape B", IP.com Prior Art Database. IP.com No. IPCOMM000107570D, Original Publication Date Mar. 1, 1992, TDB n10A Mar. 1992, pp. 186-190. IP.com Electronic Publication Date Mar. 22, 2005. Copyright © IP.com.

IBM, "(WN) Method and Apparatus to Utilize Spare Latches as Measurement Latches in an Integrated Circuit", IP.com Prior Art Database. IP.com No. IPCOM000138259D. Original Publication Date Jul. 12, 2006. IP.com Electronic Publication Date Jul. 12,2006, pp. 1-2. Copyright © IP.com.

* cited by examiner

*Primary Examiner* — April Y Blair
*Assistant Examiner* — Thien D Nguyen
(74) *Attorney, Agent, or Firm* — Jonathan V. Sry; Robert R. Williams

(57) ABSTRACT

An IO structure, method, and apparatus are disclosed for using an IEEE™ 1149.1 boundary scan latch to reroute a functional path. The method for a chip using IEEE™ 1149.1 boundary scan latches may include using the IEEE™ 1149.1 boundary scan latches for testing IO on the chip in a test mode. The method may also include using information stored in the IEEE™ 1149.1 boundary scan latches to route signals around a failing path in a functional mode.

6 Claims, 13 Drawing Sheets

|  | TEST MODE DRV | TEST MODE REC | NORMAL MODE | REPAIR MODE HIGH | REPAIR MODE LOW |
|---|---|---|---|---|---|
| DATA 310 | ANY | ANY | ANY | OFF | ON |
| ENABLE 312 | ANY | ANY | ANY | ON | OFF |
| INTEST 616 | OFF | ON | OFF | OFF | OFF |
| EXTEST 314 | ON | OFF | OFF | OFF | OFF |
| REPAIR 316 | OFF | OFF | OFF | ON | ON |
| CONNECTS DRIVER 212 TO | 2D5 | NOTHING | 2F2 | 2F3 | 2F1 |
| CONNECTS ESL 216 TO | 4-E5 | NOTHING | EP2 | 234 | 222 |
| CONNECTS RSL 218 TO | 214 | 2B4 | 214 | 226 | 236 |

| | TESTING MODE | REPAIR TRISTATE | NORMAL MODE | REPAIR MODE HIGH | REPAIR MODE LOW |
|---|---|---|---|---|---|
| DATA 9D3 | ANY | OFF | ANY | ANY | ON |
| ENABLE 9E3 | ANY | OFF | ANY | ON | OFF |
| DATA 9D2 | ANY | ON | ANY/OFF/ANY | ANY | ANY |
| ENABLE 9E2 | ANY | ON | ANY/ANY/OFF | ANY | ANY |
| EXTEST 1012 | ON/OFF | OFF | OFF | OFF | OFF |
| REPAIR 1020 | OFF | ON | OFF/ANY/ANY | ON | ON |
| | | | | | |
| CONNECTS DRIVER TO | 9-E3 | ZERO | ENABLE1 | ENABLE2 | ENABLE0 |

MANAGING REDUNDANCY REPAIR USING BOUNDARY SCANS

TECHNICAL FIELD

Embodiments described herein generally relate to electronic components, and more specifically, to testing electronic components.

BACKGROUND

Digital Integrated Circuits (ICs) can be prone to defects introduced during a manufacturing process. To test for defects, a test vector may be introduced into a standard IEEE™ 1149.1 boundary scan channel, and the result of the test vector that is applied to the digital IC scan channels may be measured. Digital IC testing systems may be designed so that an external input pin transmits directly to a scan channel, which tests the digital logic.

SUMMARY

A structure, method, and apparatus are disclosed for using a IEEE™ 1149.1 boundary scan latch to reroute a functional path.

One embodiment is directed towards an input/output (IO) structure. The IO structure may have a first IO cell on a first chip. The first IO cell may have a first functional input. The first chip may also have a second IO cell with a second functional input. The first IO cell may also have a driver to drive off chip, a first serial boundary scan latch, and a first parallel boundary scan latch to receive data from the first serial boundary scan latch. The first IO cell may also have a multiplexer to select for input, to the driver, an output of the first parallel boundary scan latch of the first IO cell in a first mode. The multiplexer may also select for input, a data output from the first functional input in a second mode. The multiplexer may also select for input the second functional input in a third mode.

Another embodiment is directed towards a method for a chip using IEEE™ 1149.1 boundary scan latches. The method may include using the IEEE™ 1149.1 boundary scan latches for testing IO on the chip in a test mode. The method may also include using information stored in the IEEE™ 1149.1 boundary scan latches to route signals around a failing path in a functional mode.

Another embodiment is directed towards an electronic apparatus using IEEE™ 1149.1 boundary scan latches. The electronic apparatus may include a plurality of functional paths between a first semiconductor chip and a second semiconductor chip. The electronic apparatus may also include a spare path between the first semiconductor chip and the second semiconductor chip. The electronic apparatus may also include the IEEE™ 1149.1 boundary scan latches used to test the functional paths and the spare path in a test mode. The electronic apparatus may also include the IEEE™ 1149.1 boundary scan latches configured to hold routing data in a functional mode to route signals around a failing functional path in the plurality of functional paths to the spare path.

BRIEF DESCRIPTION OF THE DRAWINGS

Embodiments are illustrated by way of example, and not by way of limitation, in the figures of the accompanying drawings in which like reference numerals refer to similar elements or steps.

DETAILED DESCRIPTION

Figure 1:
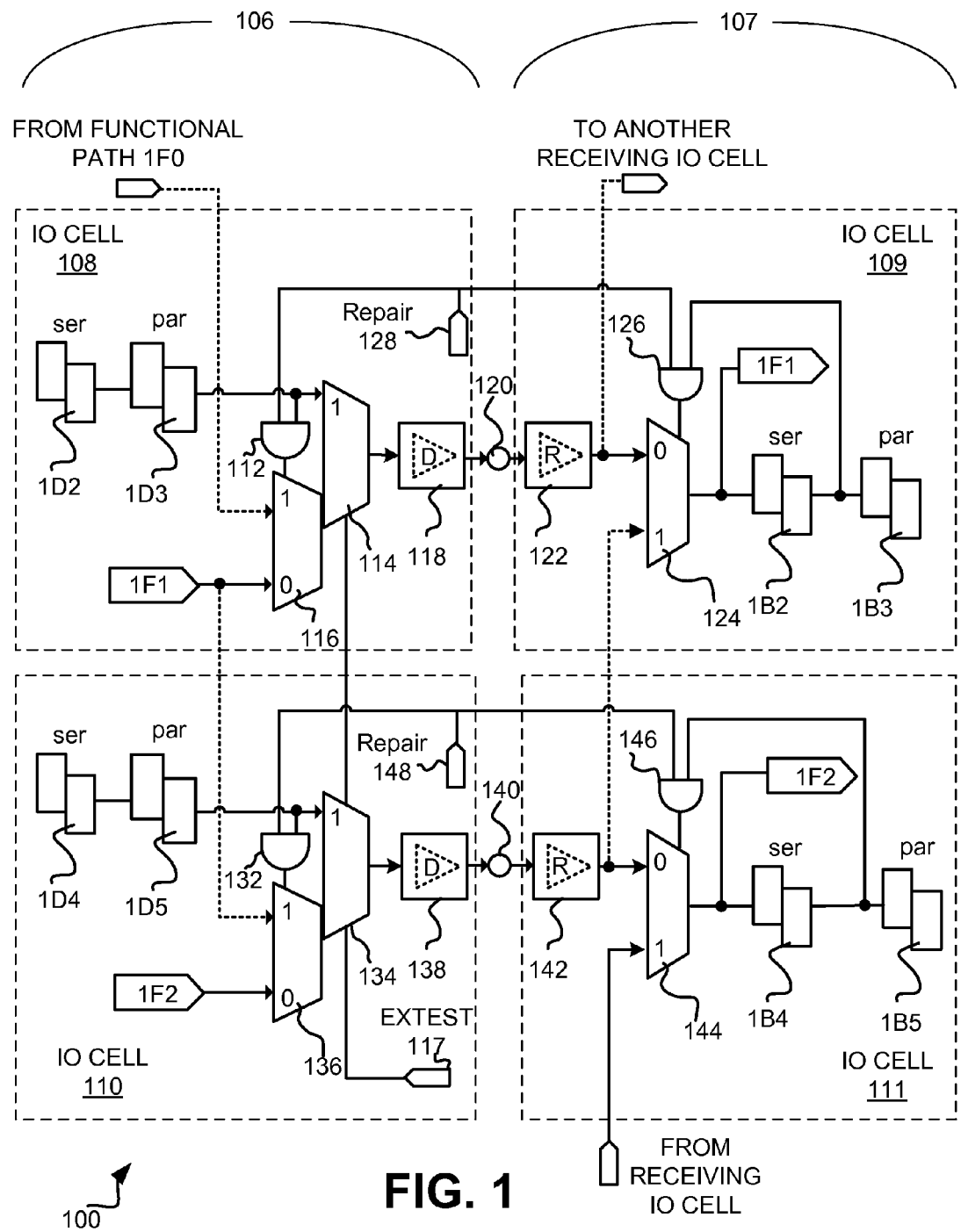
FIG. 1 illustrates a rerouting device that reroutes one functional path through an IO cell, according to various embodiments.

A number of defects may be created during the manufacturing of a digital integrated circuit (IC). These defects may affect the logic operation of the digital IC, which in turn adversely influences semiconductor chip quality and costs. Industry has developed a number of testing techniques to test for the defects. These techniques may rely on built in wires to transmit test vectors into the digital ICs via scan channels.

Since space for external test conduits is limited in a chip, industry has developed a boundary scan architecture, that standardizes the external pins, or Input/Outputs (IOs) found on a digital IC. This boundary scan architecture is governed by a standard, IEEE™ 1149.1 or JTAG that uses a common 4-5 wire bus for testing a digital IC. The IEEE™ 1149.1 standard may be used to test chip-to-chip interconnects. In some configurations, a boundary scan register may be used to enable or drive a signal across an IO.

A failing IO may generally kill the function of a digital IC. Ordinarily, the connection between two elements in a failing IO could be corrected by using a spare lane to reroute the test signal around the failing IO. The failing IO connection may be corrected with extra functional bits with functions like ECC or with extra functional rails that can be redirected in a functional use. However, by adding spare lanes, additional circuitry may be needed to control the spare lane which may increase the complexity and wiring needs of the digital IC.

Boundary scan latches in a standard such as IEEE™ 1149.1 are rarely used after a test and may remain idle in a digital IC after testing operations are completed. The current disclosure may be directed toward reusing the existing boundary scan latches required by the IEEE™ 1149.1 standard as a selector for redirecting functional paths around a faulty I/O circuit to a spare lane during functional operation. An IO may be rerouted to an adjacent IO when the assigned IO is found to be faulty, according to an embodiment. This reassignment continues in a serial fashion until a spare IO is used. The disclosure may also allow repairs to two or more IOs by increasing the number of spare IOs. A map of failing IOs can be included on the IC in fuses or off the IC in a separate storage element such as a serial electrically erasable programmable read-only memory (SEEPROM). This information is recovered as part of a power on with adjacent chips aligned with the same corrections. The rerouting of IOs could also be adjusted on the fly after chips are attached and an IO interconnect test finds the failures.

Features illustrated in the drawings are not necessarily drawn to scale. Descriptions of well-known components and processing techniques are omitted so as to not unnecessarily obscure the embodiments of the disclosure. The examples used herein are intended merely to facilitate an understanding of ways in which the embodiments may be practiced and to further enable those of skill in the art to practice the disclosure. It is also to be understood that the descriptions of the embodiments are provided by way of example only, and are not intended to limit the scope of this disclosure as claimed. Throughout this disclosure, the term first, second, third, or fourth, e.g., first IO cell, first enable input, may be used to describe a reference point for a device and shall not limit this disclosure to any particular operation. For example, a first IO cell could represent an order in relation to other IO cells, e.g., a first IO cell, followed by a second IO cell, or could represent the first IO cell to have a non-functioning IO in a particular rerouting device. In this example, the first IO cell could have a second IO cell above or below it and a third IO cell above or below it.

FIG. 1 illustrates a rerouting device 100 that may reroute a functional path through an IO cell, according to various embodiments. The rerouting device 100 is shown with two chips, a first chip 106 and a second chip 107. The first chip has two IO cells, a first IO cell 108 and a second IO cell 110. The second chip 107 or the receiving chip has two IO cells, a first receiving IO cell 109 and a second receiving IO cell 111. The first chip 106 connects to the receiving chip 107 via lanes 120 and 140, which may comprise, for example signal pins, printed circuit board wiring, vias, and the like. The term receiving chip 107 may be used to refer to the second chip 107 throughout this disclosure. In the shown embodiment, IO cells 108, 110, are both shown with a unidirectional configuration, but other configurations, e.g., bidirectional, are contemplated.

The rerouting device 100 may reroute a functional path from an IO cell resulting from a failing IO to another IO cell until a spare IO cell is reached. For example, if IO 120, the driver 118, or the receiver 122 is failing, then a functional path 1F1 may be rerouted through the second IO cell 110 on the first chip 106, and the second receiving IO cell 111, until it is connected with the first receiving IO cell 109. The second IO cell 110 and second receiving IO cell 111 may both be considered the spare IO cell. The functional path 1F1 may have two ends. At the first IO cell 108, there is a functional input, at the first receiving IO cell 109, there is a functional output. Both the functional input and functional output are part of the same functional path. Throughout this disclosure, a particular functional path may be referred to generically with or without regard to the input or output. In another embodiment, if IO cell 108 is failing, and IO cell 110 is not a spare IO cell, then IO cell 110 may be further rerouted to the IO cell below and so forth in a serial manner. In another embodiment, the IO cell 108 may be rerouted to an IO cell above until a spare lane is reached. Although one spare IO cell, e.g. IO cell 110, is shown, the rerouting device 100 may contain any number of spare IO cells.

To illustrate the connections between components within the rerouting device 100, the connections within IO cell 108 and receiving IO cell 109 will be described. The IO cell 108 may have the components prescribed by IEEE™ 1149.1. The components may include scan latches, such as a serial boundary scan latch 1D2 and parallel boundary scan latch 1D3. The IO cell 109 may have serial boundary scan latch 1B2 and parallel boundary scan latch 1B3, according to an embodiment.

Throughout this disclosure, both serial and parallel boundary scan latches are assumed to be part of the IEEE™ 1149.1 standard. Other configurations where serial and parallel boundary scan latches mentioned in this disclosure do not comply with the JTAG standard are contemplated. Herein, "serial boundary scan latch" may be referred to as "serial" and "parallel boundary scan latch" may be referred to as "parallel".

In IO cell 108, the serial boundary scan latch 1D2 may couple to the parallel boundary scan latch 1D3. The parallel boundary scan latch 1D3 may couple with an AND gate 112 and a multiplexer (MUX) 114. The MUX 114 may receive two inputs, one from the parallel boundary scan latch 1D3 and one from the output of a MUX 116. The input of MUX 114 may be selected by the EXTEST 117. The EXTEST 117 may be a signal that initiates a test mode (discussed further below), according to an embodiment. The EXTEST 117 may be a global signal, in some embodiments. The MUX 114 may output to a driver 118. The driver 118 may be configured to output to an IO 120. The IO 120 may be the connection between the first chip 106 and the receiving chip 107 and may comprise a C4 (controlled collapse chip connect), or a pin, and/or printed circuit wiring in some embodiments. Although shown as external, the IO 120 may be either external to the IO cell 108 or internal to the IO cell 108. The driver 118 may drive a signal to the receiving IO cell 109 and may consist of logic elements.

The driver 118 may drive a receiver 122 on the receiving IO cell 109. The receiver 122 may be configured to receive the signal driven by the driver 118. The receiver 122 may be coupled to a MUX 124 and a MUX from another receiving IO cell. The MUX 124 may receive two inputs, one from the receiver 122 and one from a receiver 142. The MUX 124 input may be selected based on a selection signal from an AND gate 126. The MUX 124 may output to a functional path 1F1 output, or functional output, and a serial boundary scan latch 1B2. The serial boundary scan latch 1B2 may output to both the AND gate 126 and a parallel boundary scan latch 1B3. The serial boundary scan latch 1B2 and parallel boundary scan latch 1B3 latches may lead to different logical parts of the chip for testing, e.g., in an INTEST mode. Serial and parallel boundary scan latches, e.g., 1B2, 1B3, 1B4, and 1B5, shown in IO cells 109 and 111 may be as defined in IEEE™ 1149.1.

The MUX 124 may receive an input signal either from the receiver 122 or the receiver 142. The selection signal from the AND gate 126 may signal the MUX 124 to select the input signal to output from the MUX 124. The AND gate 126 may receive two inputs, one from a repair signal 128 and another from the serial boundary scan latch 1B2. A low, or logical zero signal from the AND gate 126 may cause the MUX 124 to select the signal from the receiver 122, for example. An active high signal, or logical one signal, from the AND gate 126 may cause the MUX 124 to select the signal from the receiver 142.

The MUX 116 may also select from the functional path 1F1 and another functional path 1F0 input from another IO cell based upon the selection signal from the AND gate 112. The AND gate 112 may receive inputs from both the parallel boundary scan latch 1D3 and the repair signal 128. An inactive low signal may cause the functional path 1F1 to be selected by the MUX 116, for example. An active high signal may cause the functional path 1F0 input to be selected. In an embodiment, the MUX 114, 116, and 124 may be a two-to-one MUX, but other configurations are contemplated.

The second IO cell 110 may have the components prescribed by IEEE™ 1149.1. The components may include boundary scan latches such as serial boundary scan latches 1D4 and parallel boundary scan latches 1D5. The second IO cell 110 may have one set of boundary scan scan latches, serial boundary scan latches 1D4 and parallel boundary scan latches 1D5, according to an embodiment.

In IO cell 110, the serial boundary scan latch 1D4 may couple to the parallel boundary scan latch 1D5. The parallel boundary scan latch 1D5 may couple with an AND gate 132 and a multiplexer (MUX) 134. The MUX 134 may receive two inputs, one from the parallel boundary scan latch 1D5 and one from the output of a MUX 136. The input of MUX 134 may be selected by the EXTEST 117. The EXTEST 117 may be a signal that initiates a test mode (discussed further below), according to an embodiment. The EXTEST 117 may be a global signal in some embodiments. The MUX 134 may output to a driver 138. The driver 138 may be configured to output to an IO 140. The IO 140 may be the connection between ICs and may be referred to as a C4, or a pin, in some embodiments. IO 140 may also comprise printed circuit wiring or other signaling path such as a cable. IO 140 may also be called a lane.

The driver 138 on IO cell 110 may drive a signal through the IO 140 to a receiver 142 on the second receiving IO cell 111. The receiver 142 may be transmitted to a MUX 144 and the MUX 124. The MUX 144 may receive two inputs, one from the receiver 142 and one from a receiver from another receiving IO cell. The receiver 142 or the receiver from another IO cell output may be the selected input signal of the MUX 144 based on a selection signal from an AND gate 146. The MUX 144 may output to a functional path 1F2 output and a serial boundary scan latch 1B4. The serial boundary scan latch 1B4 may output to both the AND gate 146 and the parallel boundary scan latch 1B5. The serial boundary scan latch 1B2 and parallel boundary scan latch 1B3 may lead to different logical parts of the IC for testing.

The MUX 144 may receive an input signal from the receiver 142 or the receiver from another receiving IO cell. The selection signal from the AND gate 146 may signal the MUX 144 to select the receiver from other receiving IO cell. The AND gate 146 may receive two inputs, one from a repair signal 148 and another from the serial 1B4. A logical zero signal from the AND gate 146 may cause the receiver 142 to be selected by the MUX 144. An active high signal from the AND gate 146 may cause the MUX 144 to select the signal from the receiver from another IO cell.

The MUX 136 may also select from the functional path 1F2 input or functional path 1F1 input based upon the selection signal from the AND gate 132. The AND gate 132 may receive inputs from both the parallel boundary scan latch 1D5 and the repair signal 148. An inactive low signal may cause the functional path 1F2 to be selected by the MUX 136. An active high signal from the AND gate 132 may cause the functional path 1F1 input to be selected.

In the test mode for IO cell 108, an active EXTEST signal 117 may be received by the MUX 114, which allows the testing parameters to be applied from the parallel boundary scan latch 1D3 and the result transmitted to the driver 118. The driver 118 may require an enable signal to further transmit the testing parameters, according to an embodiment. The driver 118 may transmit the testing parameters to a receiver 122 through the IO 120. The MUX 124 may select the testing parameters from the receiver 122, if an inactive low selection signal is received by the MUX 124. Throughout this disclosure, the test mode may also be referred to as a first mode.

The AND gate 126 may select the receiver 122 if the repair signal 128 is a logical zero. If the repair signal 128 is a logical zero, then the result at the AND gate 126 will be a logical zero regardless of what the signal is at the serial boundary scan latch 1B2. The repair signal 128 may be controlled through a global repair signal or locally. For example, the repair signals 128 and 148 may be linked to the same global signal, in an embodiment. In another embodiment, the repair signals 128 and 148 may select each IO cell, or select groups of IO cells, either on the same or different ICs.

Under testing operations, the receiver 122 may be selected and the output from the receiver 122 connects to the serial boundary scan latch 1B2. The serial boundary scan latch 1B2 may output the testing parameter to the parallel boundary scan latch 1B3. The test mode on the IO cell 111 may work in a similar manner.

In the normal mode, IO cell 108 may connect a functional path 1F1 input through the IO 120, according to an embodiment. The functional path 1F1 input may be received by MUX 116. The MUX 116 may select the functional path 1F1 input if a logical zero signal is produced by the AND gate 112. The AND gate 112 may produce a logical zero signal if the repair mode signal 128 is a logical zero. This may allow the MUX 116 to output to an input of MUX 114. The functional path 1F1 input may be selected by MUX 114 if the EXTEST 117 is a logical zero. The MUX 114 may then couple the functional path 1F1 input through the driver 118, IO 120, and receiver 122 on the receiving IO cell 109. The functional path 1F1 input may be selected by the MUX 124 based on a logical zero signal of the AND gate 126. The AND gate 126 may output a logical zero signal if the repair signal 128 is a logical zero. The MUX 124 may select the functional path 1F1 input to couple to the functional path 1F1 output. Throughout this disclosure, the normal mode may also be referred to as a second mode.

In the repair mode, a functional path input from an IO cell with a non-functional IO may be routed through another IO cell, which may be routed to yet another IO cell, until a spare IO cell is reached. For purposes of illustration, IO 120 is assumed to be non-functional. Also, IO cell 110 is assumed to be a spare IO cell and functional path 1F2 is assumed to be a spare lane. The functional path 1F2 may be assumed to lack a functional transmission. In other embodiments, transmission of data may occur with both 1F1 and 1F2 using the IO 140. The transmission may be synchronized with rerouted data from 1F1 meaning that 1F1 and 1F2 are not using the IO 140 at the same time. Throughout this disclosure, the repair mode may also be referred to as a third mode, but more than one repair mode may exist, e.g., the embodiment on FIG. 2.

In the repair mode, the repair mode signal 148 may be on while the EXTEST 117 may be turned a logical zero. MUX 136 may receive inputs from 1F2 and from 1F1, according to an embodiment. The MUX 136 may select 1F1 based on a selector input from the output of the AND gate 132. In order to select 1F1, the AND gate 132 may output a logical one signal. In order to output the logical one signal, both the repair signal 148 and the parallel boundary scan latch 1D5 may be at a logical one.

The output of MUX 136 and the parallel boundary scan latch 1D5 may form inputs for MUX 134 as mentioned above. If the EXTEST signal is at a logical zero, or at a logical low, then the output of the MUX 136 is selected, which may be the functional path 1F1. The functional path 1F1 may continue to be coupled to the driver 138, the IO 140, and the receiver 142. The receiver 142 may connect the functional path to MUX 124. The MUX 124 may select the functional path 1F1 if the AND gate 126 is at a logical one. The AND gate 126 may be at a logical one if both the repair signal 128 and the serial 1B2 are at a logical one. The MUX 124 may connect the functional path 1F1 from the receiver 142 to the output of the MUX 124, which may be the functional path 1F1. The serial 1B2 may be controlled by internal logic or may be otherwise matched to the state of the repair signal 128.

Similarly, the functional path 1F2 may be rerouted through the IO cell below until a spare IO cell is reached. A switching logic on the IO cell below may be configured so that it accepts the functional path 1F2 input and drives the functional path through the IO (not pictured) to the receiving IO. The MUX 144 may accept the rerouted functional path 1F2 from the receiving IO cell below (not pictured). The MUX 144 may also enter the repair mode and be configured to select the rerouted functional path 1F2 from the receiving IO cell below (not pictured).

Figure 2:
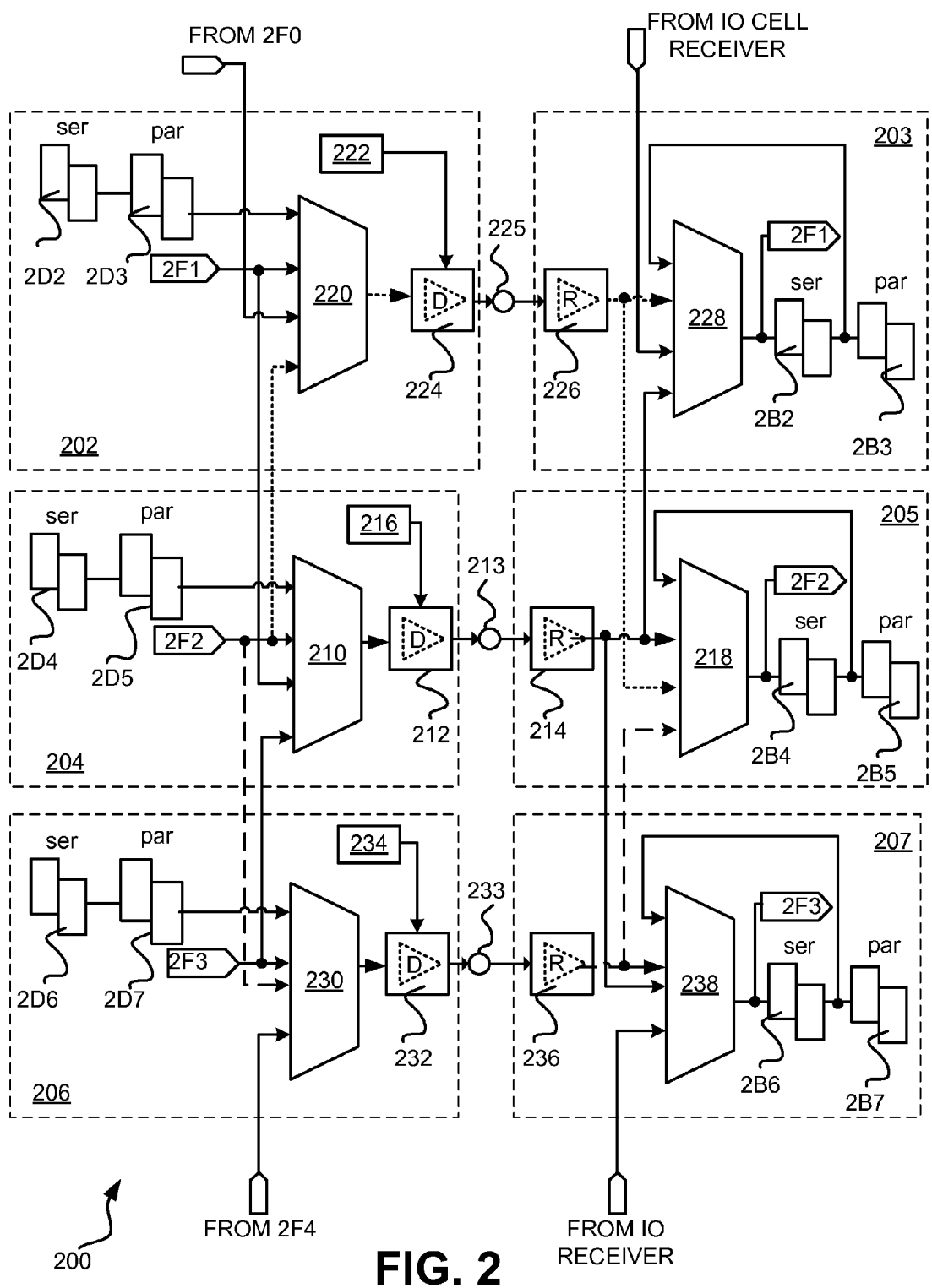
FIG. 2 illustrates a rerouting device that reroutes one or more functional paths through one or more IO cells, according to various embodiments.

FIG. 2 illustrates schematic diagram of a rerouting device 200, according to various embodiments. The rerouting device 200 shows three IO cells on one chip, e.g., a first chip: a first IO cell 202, a second IO cell 204, and a third IO cell 206. The IO cells may be referred to by number throughout this disclosure. On a second chip, there may be three receiving IO cells: a first receiving IO cell 203, a second receiving IO cell 205, and a third receiving IO cell 207 with the first receiving IO cell 203 coupled to the first IO cell 202 through an IO 225 and so forth. The rerouting device 200 may have IO cells above IO cell 202 and IO cells below 206 in a serial fashion. The rerouting device 200 may have more or fewer than three IO cells shown.

In some embodiments, the rerouting device 200 may be configured to reroute a functional path either to the IO cell above or below it. The functional path may be rerouted to the IO cell above or below it until a spare IO cell is reached. In some embodiments, the rerouting device may reroute two non-functional IOs, but more non-function IOs may be supported in a different configuration of the embodiment. An IO cell in FIG. 1 and FIG. 2 may represent two chips with one IO cell on the first chip driving to the receiving IO cell on the second chip, according to an embodiment. A particular IO in an IO cell may represent the boundary between two chips. In an embodiment, one chip may have a driver and another chip may have a receiver.

In order to illustrate the repair mode (described below), the description may focus on IO cell 204. IO cell 204 may have a serial boundary scan latch 2D4 and parallel boundary scan latch 2D5 that may function in a similar manner to the serial boundary scan latch 1D2 and parallel boundary scan latch 1D3 from FIG. 1. The IO cell 204 may include a driver switching logic (DSL) 210. The parallel boundary scan latch 2D5 may couple to the DSL 210 at a first input. The DSL 210 may receive inputs from the parallel boundary scan latch 2D5 at the first input, a functional path 2F1 input at a third input, a functional path 2F2 input at a second input, and the functional path 2F3 input at a fourth input. The DSL 210 may select one input to couple with the driver 212. The driver switching logic 210 may include a number of logic devices and may accept four inputs and be controlled by two selectors. A DSL in this disclosure may be referred to generically as a multiplexer. The driver switching logic is described more fully on FIG. 5.

The driver 212 may be enabled by enable switching logic (ESL) 216. The ESL 216 may further contain logic gates (described further in FIG. 4) and be coupled to ESL elements from the IO cell above or below it. For example, ESL 216 may couple to both ESL 222 and ESL 234 and may receive enable signals. The ESL 216 may synchronize with the DSL 210, according to an embodiment. An ESL may be referred to generically throughout this disclosure as a multiplexer.

Once enabled, the driver 212 may connect to an IO 213. The IO 213 may function in the same manner as the IO 120 in FIG. 1. The IO 213 may further couple with the receiver 214 on the receiving IO cell 205. The receiver 214 may couple with the receiver switching logic (RSL) 218 and form a second input. The RSL 218 may receive four inputs: a second input from the receiver 214, a third input the receiver 226 on the receiving cell 203, a fourth input from the receiver 236 on the receiving cell 207, and a first input from a serial boundary scan latch 2B4. The RSL 218 may output to both the functional path 2F2 output and the serial boundary scan latch 2B4. The serial boundary scan latch 2B4 may output to a parallel boundary scan latch 2B5. In some embodiments, the DSL 210 and RSL 218 may be 4-to-1 MUXs with two enable inputs. In other embodiments, the DSL 210 and RSL 218 may have three, two-to-one MUXs with three selector inputs. An RSL may be referred to generically throughout this disclosure as a multiplexer.

IO cell 202 may have a serial boundary scan latch 2D2 and parallel boundary scan latch 2D3 that may function in a similar manner to the serial boundary scan latch 1D2 and parallel boundary scan latch 1D3 from FIG. 1. The parallel boundary scan latch 2D3 may couple to a driver switching logic (DSL) 220 (described further in FIG. 5). The driver switching logic 220 may receive inputs from the parallel boundary scan latch 2D3, the functional path 2F1, the functional path 2F2, and the functional path 2F0 (not shown) and select one input to couple with the driver 224. The driver 224 may be enabled by enable switching logic 222. The enable switching logic (ESL) 222 may further contain logic gates (described further in FIG. 4) and be coupled to ESL elements from the IO cell above or below it. For example, ESL 222 may couple to both ESL 216 and an ESL from the IO cell above (not pictured) and may receive and select enable signals.

Once enabled, the driver 224 may connect to an IO 225. The IO 225 may function in the same manner as the IO 120 in FIG. 1. The IO 225 may further couple with the receiver 226 on the receiving IO cell 203. The receiver 226 may couple with the receiver switching logic (RSL) 228 and form an input. The RSL 228 may receive four inputs from the receiver 226, another receiving IO cell receiver (not shown), the receiver 214, and the serial boundary scan latch 2B2. The RSL 228 may output to both the functional path 2F1 and the serial boundary scan latch 2B2. The serial boundary scan latch 2B2 may output to a parallel boundary scan latch 2B3.

IO cell 206 may have a serial 2D6 and parallel boundary scan latch 2D7 that may function in a similar manner to the serial boundary scan latch 1D2 and parallel boundary scan latch 1D3 from FIG. 1. The parallel boundary scan latch 2D7 may couple to a driver switching logic (DSL) 230 (described further in FIG. 5). The driver switching logic 230 may receive inputs from the parallel boundary scan latch 2D7, the functional path 2F3, the functional path 2F2, and the functional path 2F4 (not shown) and select one input to couple with the driver 232. The driver 232 may be enabled by enable switching logic (ESL) 234. The ESL 234 may further contain logic gates (described further in FIG. 4) and be coupled to ESL elements from the IO cell above or below it. For example, ESL 234 may couple to both ESL 216 and an ESL from the IO cell below (not pictured) and may receive and select enable signals.

Once enabled, the driver 232 may connect to an IO 233. The IO 233 may function in the same manner as the IO 120 in FIG. 1. The IO 233 may further couple with the receiver 236 on the receiving IO cell 207. The receiver 236 may couple with the RSL 238 and form an input. The RSL 238 may receive four inputs from the receiver 236, another IO cell receiver (not shown), the receiver 214, and the serial boundary scan latch 2B6. The RSL 238 may output to both the functional path 2F3 and the serial boundary scan latch 2B6. The serial boundary scan latch 2B6 may output to a parallel boundary scan latch 2B7.

The rerouting device may have four modes of operation: test mode, normal mode, high repair mode, and low repair mode. Throughout this disclosure, the first mode may refer to the test mode, the second mode may refer to the normal mode, the third mode may refer to the high repair mode, and a fourth mode may refer to the low repair mode.

To illustrate the operation of the test mode in the rerouting device, IO cell 204 may be used as an example. The spare IO cells 202, 206, may operate in a similar manner. A serial boundary scan latch 2D4 boundary scan latch may receive test signals and output to the parallel boundary scan latch 2D5 which may output to a DSL 210. In test mode, the DSL 210 may select the output from the parallel boundary scan latch 2D5 to transmit to the driver 212. The driver 212 may output a signal through IO 213 to a receiver 214 on the receiving IO cell 205. The driver 212 may be enabled by ESL 216, according to various embodiments. The ESL 216 may be further described in FIG. 4 and may enable the driver 212 to output to the receiver 214 via the IO 213. In some embodiments, the IO 213 may transmit the test results to an external tester. In an INTEST mode, where the testing signal originates from within the receiving IO cell 205, the RSL 218 may have any number of logic elements to couple the output of the serial boundary scan latch 2B4 to the input of the serial boundary scan latch 2B4. When the test signal is received by the RSL 218, the RSL 218 may be configured to select the output of serial 2B4. The serial boundary scan latch 2B4 may apply a separate test signal to different parts of the circuit and receive a result. Once selected by RSL 218, the result may be transmitted through the functional path 2F2 or may be cycled through the serial boundary scan latch 2B4. The serial boundary scan latch 2B4 may further apply the test signal to scan latches and transmit the result to the parallel boundary scan latch 2B5.

To illustrate the operation of the normal mode in the rerouting device, IO cell 204 may be used as an example. The spare IO cells 202, 206, may operate in a similar manner. Under the normal mode, the functional path 2F2, may couple to the driver 212 through the DSL 210. The DSL 210 may be configured to select functional path 2F2. The DSL 210 output may be coupled to the driver 212. The driver 212 may be enabled by the ESL 216. The driver 212 may transmit the data to a receiver 214 on the receiving IO cell 205 via the IO 213. The receiver 214 may couple to the functional path 2F2 through the RSL 218. The RSL 218 may contain logic that connects the functional path 2F2 input to the functional path 2F2 output upon the presence of a selecting signal.

For both the high repair mode and the low repair mode, it is assumed that the IO 213 is not functioning, meaning that there is not a transmission from driver 212 to the receiver 214. For the purpose of simplicity, the IO cells 202, 206 may be the spare IO cells and may be used to illustrate the connections of the different repair paths. In another embodiment, if both IO 213 from IO cell 204 and IO 233 from IO cell 206 are not functioning, then both the high repair mode and the low repair mode may be used. For example, the functional path 2F2 may be diverted high through IO cell 202 while the functional path 2F1 from IO cell 202 may be diverted to an IO cell above it until a spare IO cell is reached. Conversely, the functional path 2F3 may be diverted to an IO cell below until a spare IO cell is reached. The shown configuration may be used to handle up to two non-functional IOs, but other configurations are contemplated.

In the repair mode high, the functional path 2F2 may be diverted through IO cell 202 and the receiving IO cell 203. For purposes of illustration, the IO cell 202 and the receiving IO cell 203 may be the spare IO cell. In this example, data may travel along the functional path 2F2 and not be able to connect to receiver 214. In some embodiments, a signal from the driver 212 and receiver 214 may trigger the repair mode. A tester may determine whether to engage in a high or low repair mode (discussed in FIG. 7). The data from functional path 2F2 may travel to the DSL 220, specifically the fourth input. The DSL 220 may be configured so that it selects the data from the fourth input, i.e., functional path 2F2. The DSL 220 may output to the driver 224. The driver 224 may be further enabled by the ESL 222. If the driver 224 receives an enable signal from the ESL 222, then the receiver 226 may couple to the functional path 2F2. In a test mode, the receiver 226 may couple to the RSL 218, according to an embodiment. The RSL 218 may be configured so that the third input from receiver 226 is selected. Therefore, the functional path 2F2 may be established when the IO 213 is not functioning.

In the repair mode low, the malfunctioning IO cell 204 may be rerouted through the spare IO cell below it, e.g., spare IO cell 206 and the receiving IO cell 207. The functional path 2F2 may provide a third input to DSL 230 that may be coupled to the driver 232. The DSL 230 may be configured in a similar manner to the DSL 210, according to an embodiment. The driver 232 may receive an enable signal from the ESL 234. The ESL 234 may be configured in a similar manner to the ESL 216, according to an embodiment. The driver 232 may transmit the data to a receiver 236 via IO 233. The receiver 236 may couple to the functional path 2F2 through the RSL 218. The RSL 218 may be configured to select the fourth input from the receiver 236.

The high repair mode and low repair mode may be performed simultaneously. For example, if there are two failing IOs, one from a first IO cell and a second IO cell, then the first IO cell may be rerouted to a spare IO above the first IO cell, and the second IO cell may be rerouted to a spare IO cell below the second IO cell. Either the high or low repair mode may involve rerouting more than one IO cell. For example, if there are three IO cells; a first IO cell, a second IO cell, and a third IO cell, and the first IO cell has the malfunctioning IO, then the data from the first IO cell functional path may be rerouted from the first IO cell through the second IO cell. The second IO cell functional path may be rerouted to the third IO cell. The third IO cell, in this example, may be the spare IO cell.

Figure 3:
FIG. 3 illustrates a table of gating signals that are used by the rerouting device of FIG. 2, according to various embodiments.

FIG. 3 illustrates a table of gate signals 300 that apply to the rerouting device 200, in particular the switching logic, e.g., ESL 216, DSL 210, and RSL 218, in IO cell 204 and IO cell 205 of FIG. 2, according to an embodiment. The gate signals 300 shown may be received by the switching logic to initiate the test mode, the normal mode, the repair mode high or the repair mode low.

The gate signals 300 illustrated in the table correspond to the gate signals received in IO cell 204 and the receiving IO cell 205. In the example used in FIG. 4-FIG. 6, an assumption is made that either IO 225 in the repair mode low configuration or IO 233 in the repair mode high configuration is nonfunctional. The example may reroute the functional path from IO cell 202 through IO 213 in the repair mode low or reroute the functional path from IO cell 206 through IO 213 in the repair mode high.

The test mode DRV may refer to the test mode that affects the IO cell 204, e.g., when the driver 212 drives the test result from the parallel boundary scan latch 2D5. The test mode DRV may include the using of either an INTEST instruction or an EXTEST instruction (although the EXTEST instruction is shown). The test mode REC may refer to the test mode that affects the IO cell 205, e.g., when the receiver 214 tests the serial boundary scan latch 2B4 and the parallel boundary scan latch 2B5 using an INTEST instruction (discussed further on FIG. 6).

Data signal 310 may refer to the control signal that may originate from 2D5. Enable signal 312 may refer to scan latches within ESL 216 (discussed in FIG. 4). The EXTEST signal 314 or INTEST signal (from FIG. 6) may trigger the test modes for the IO cell 204 and may be global signals like the EXTEST signal 117 in FIG. 1. The repair signal 316 may refer to a selection signal that may cause the selection of functional paths from different IO cells. The repair signal 316 may be either global, local, or apply to groups of IO cells and configured similar to the repair signals 128, 148, from FIG. 1. In the shown embodiment, the gate signals 300 may be the same for all of the switching logic, i.e., data 310 may be the same signal for DSL 210 and ESL 216. The gate signals 300 are an example of one configuration of the IO cell and are not meant to be restrictive. In one embodiment, the gate signals 300 may be activated by fuses or SEPROM. SEPROM may be a side chip with burnable memory. In another embodiment, a driver may be programmed with a particular unique identification that allows for repairs.

Figure 4:
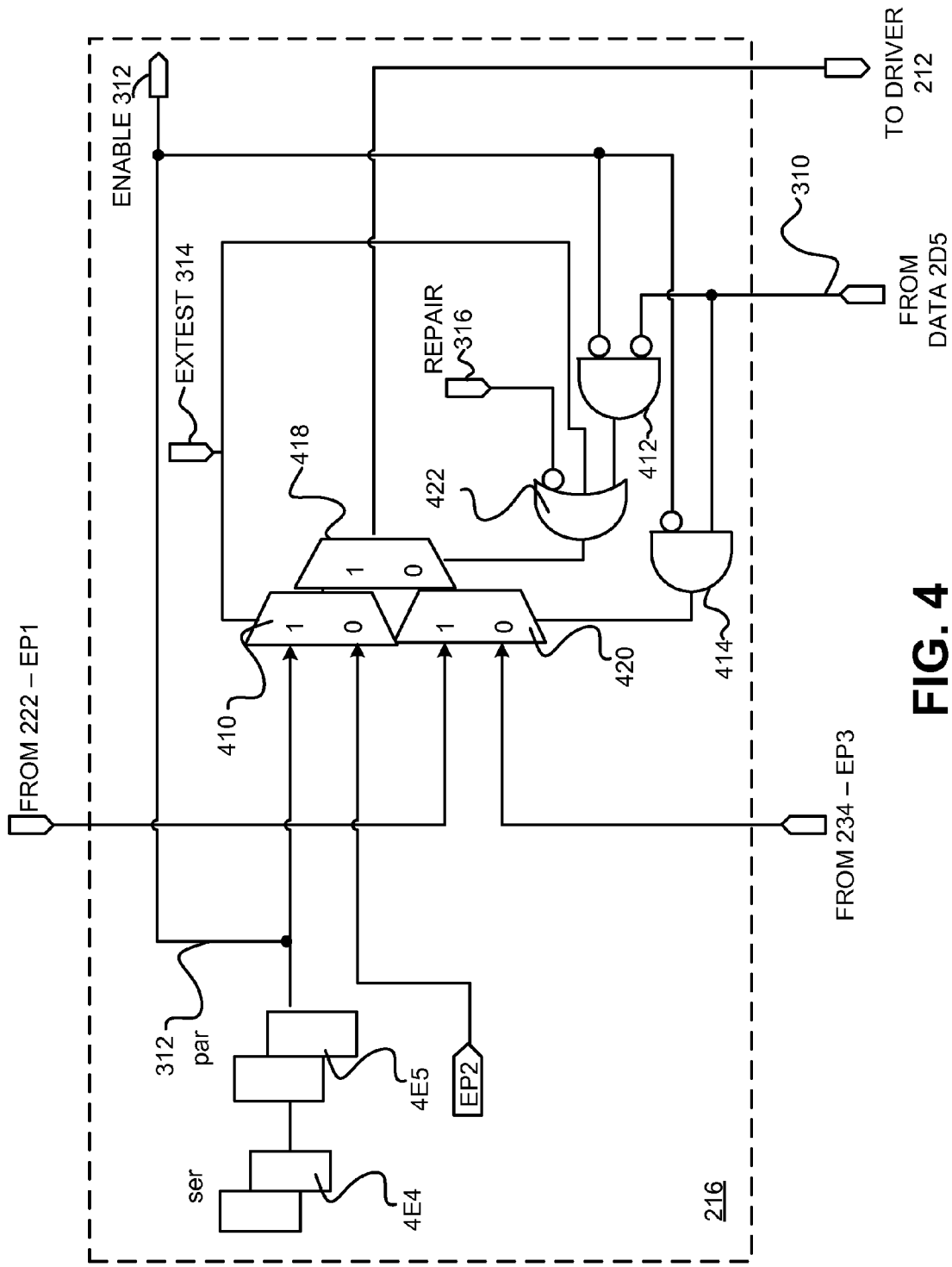
FIG. 4 illustrates an enable switching logic for a rerouting device, according to various embodiments.

FIG. 4 illustrates a schematic diagram of an ESL 216, according to an embodiment. The ESL 216 may have a enable serial boundary scan latch 4E4 which may transmit testing signals to various scan channels. The enable parallel boundary scan latch 4E5 may receive the testing signal from the serial boundary scan latch 4E4. The enable serial boundary scan latch and the enable parallel boundary scan latch may be referred to as serial and parallel. The parallel boundary scan latch 4E5 may transmit the testing signal to one or more scan latches, according to an embodiment.

The parallel boundary scan latch 4E5 may transmit the result of the testing signal to a MUX 410. The output from the parallel boundary scan latch 4E5 may be referred to as an enable signal 312 and may provide the control for one or more MUXs in the IO cell 204, and the receiving IO cell 205. The MUX 410 may receive inputs, the parallel boundary scan latch 4E5 at a first input and an enable path EP2 at a second input. An enable path may also be referred to generically as an enable input throughout this disclosure. The MUX 410 may be selected by an EXTEST signal 314. A logical one signal from EXTEST 314 may select the parallel boundary scan latch 4E5. The parallel boundary scan latch 4E5 may also output the enable signal 312 to an AND gate 412, and AND gate 414.

MUX 418 may receive inputs from MUX 410 and MUX 420. MUX 418 may select the output from MUX 410 based on a selection from an OR gate 422 The OR gate 422 may be a logical one or a zero depending on a signal from repair 316, EXTEST 314, and AND gate 412. The AND gate 412 is shown as receiving the inverted enable signal 312 and the inverted data signal 310 from 2D5 from FIG. 2. In some embodiments, the AND gate 412 with two inverted inputs may be a NOR gate. As long as the repair 316 is zero or EXTEST 314 is one or the NOR gate 412 receives a logical zero from DATA 2D5 and the enable signal 312, then the MUX 418 selects the output of MUX 410. The MUX 418 may couple to the driver 212, according to an embodiment.

MUX 420 may receive inputs from enable path EP1 from ESL 222 at a third input and from enable path EP3 from ESL 234 at a fourth input. Use of the enable paths, e.g., EP1, EP3, may correspond to use of the functional paths, e.g., 2F1, 2F3. The enable path may provide an enable signal to the driver 212. The inputs of MUX 420 may be selected by the output of AND gate 414. The AND gate 414 may receive an inverted enable signal 312 and a data signal 310. The EP1 is only selected by MUX 420 when the enable signal 312 is a logical zero and the DATA 3D3 is a logical one. The driver 212 may receive the output of MUX 420 when MUX 418 selects the output of MUX 420. The MUX 418 selects output of MUX 420 when the output of NOR 412 is a logical zero, EXTEST 314 is a logical zero, and REPAIR 316 is a logical one.

In the test mode, the ESL 216 may be configured to couple parallel boundary scan latch 4E5 to driver 212. The data 310, enable 312, EXTEST 314, and repair 316 gating signals 300 may be used according to the table on FIG. 3. In the test mode, the driver 212 may receive the test signal from the parallel boundary scan latch 4E5 and be enabled to transmit the test signal from the parallel boundary scan latch 2D5 according to an embodiment.

In the normal mode, the ESL 216 may be configured to connect EP2 to the enable of the driver 212. The EP2 may couple to the MUX 410. EP2 may be selected if the EXTEST 314 is a logical zero. Once selected, EP2 may form an input to MUX 418. EP2 may be selected if the repair 316 is a logical zero or if the enable 312 and data 3D3 are both a logical zero. EP2 may connect to the driver 212.

In the repair mode low, the IO cell 204 may receive a functional path 2F1 from IO cell 202. The repair mode low is used to divert the enable path EP1 to ESL 216. Therefore, the ESL 216 may receive EP1 from ESL 222 (similar to EP2). For purposes of simplicity, EP1 may be received by ESL 216 at the MUX 420. The MUX 420 may select the EP1 based on a signal from the data 310 and enable 312 at AND gate 414. If data 310 is a logical one and enable 312 is a logical zero, then EP1 may be selected. The output of MUX 420 may be received by MUX 418. The MUX 418 may select EP1 based on the OR gate 422. The MUX 418 may select EP1 if repair is a logical one, EXTEST 314 is a logical zero, and data 310 is a logical one and enable 312 is a logical zero. After EP1 is selected, then EP1 is may be coupled to the enable of the driver 212. Therefore, the EP1 may act in place of EP2.

In the repair mode high, the IO cell 204 may receive an input from the cell below it, e.g., IO cell 206 or the IO cell 206 may reroute the functional path 2F3 to the IO cell above, e.g., IO cell 204. The ESL 234 may be coupled to ESL 216 in a similar fashion to ESL 222. In repair mode high, EP3 from ESL 234 may couple to the driver 212. EP3 may be received by MUX 420. The MUX 420 may select EP3 if data 310 is a logical zero, and enable 312 is a logical one, or if both enable 312 and data 310 are a logical one. The MUX 420 may couple to MUX 418. The MUX 418 may select EP3 if repair 316 is a logical one, EXTEST 314 is a logical zero, and data 310 is a logical zero, and enable 312 is a logical one or if both enable 312 and data 310 are logical ones. EP3 may couple to the driver 212 and enable the driver 212.

Figure 5:
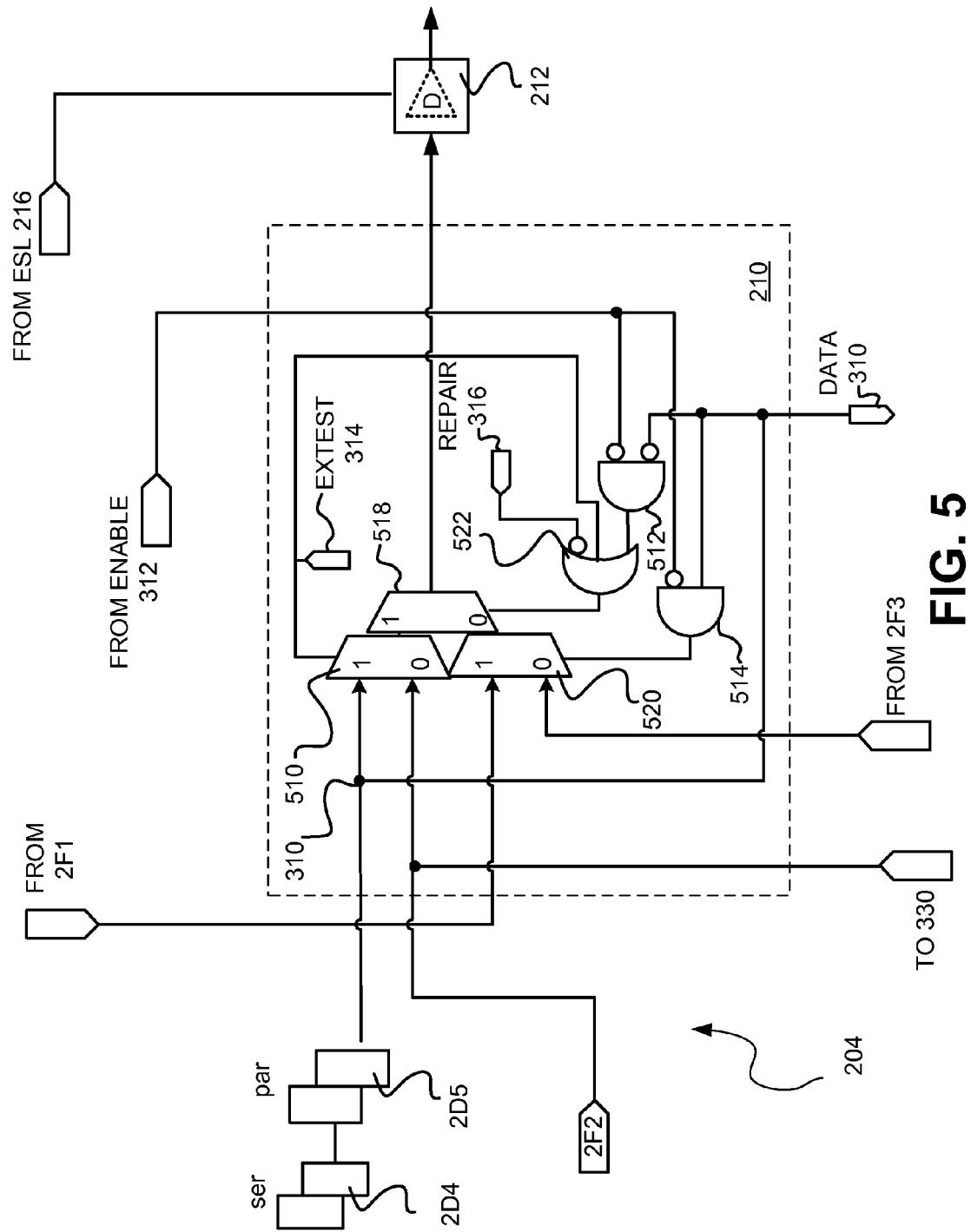
FIG. 5 illustrates a driver switching logic for a rerouting device, according to various embodiments.

FIG. 5 illustrates details of DSL 210 from the IO cell 204 from FIG. 2, according to an embodiment. DSL 210 may be structured in a similar manner to the logic on ESL 216. The parallel boundary scan latch 2D5 may transmit the result of the testing signal to a MUX 510 at a first input. The output from the parallel boundary scan latch 2D5 may be referred to as a data signal 310 and may provide the control for one or more MUXs in the IO cell 204. The MUX 510 may receive inputs from the parallel boundary scan latch 2D5 and the functional path 2F2 at a second input. The MUX 510 may be selected by an EXTEST signal 314. A logical one signal from EXTEST 314 may select the parallel boundary scan latch 2D5. The parallel boundary scan latch 2D5 may also output the enable signal 312 to an AND gate 512, and AND gate 514.

MUX 518 may receive inputs from MUX 510 and MUX 520. MUX 518 may select the output from MUX 510 based on a selection from an OR gate 522 The OR gate 522 may be a logical one or a logical zero depending on a signal from repair 316, EXTEST 314, and a AND gate 512. The AND gate 512 may receive the inverted enable signal 312 from parallel boundary scan latch 4E5 and the inverted data signal 310 from 2D5 from FIG. 3. The AND gate 512 with two inverted inputs may also be a NOR gate. As long as the repair 316 is a logical zero, EXTEST 314 is a logical one, or data 310 and enable 312 are both a logical zero, then the MUX 518 selects the output of MUX 510. The MUX 518 may couple to the driver 212, according to an embodiment. MUX 520 may receive inputs from 2F1 from IO cell 202 at the third input and from 2F3 from IO cell 206 at the fourth input. The inputs of MUX 520 may be selected by the output of AND gate 514. The AND gate 514 may receive an inverted enable signal 312 and a data signal 310. The inputs of MUX 520 may be selected in the manner described below.

The MUX 510 may select an input based on signals from the table 300 on FIG. 3. The DSL 120 may use four modes, a testing mode, a normal mode, a repair mode low, and a repair mode high.

In the testing mode, the test signal may be applied to the serial boundary scan latch 2D4 and parallel boundary scan latch 2D5 and the results are transmitted to the driver 212. The DSL 210 may receive a test signal from the parallel boundary scan latch 2D5. The parallel boundary scan latch 2D5 may transmit the testing signal to one or more scan channels, according to an embodiment. The parallel boundary scan latch 2D5 may transmit the testing signal to a MUX 510. The MUX 510 may receive inputs from the parallel boundary scan latches 2D5 and 2F2 The parallel boundary scan latch 2D5 may also output the data signal 310 to the AND gate 512, and AND gate 514. The MUX 510 may be selected from a signal from EXTEST 314. A "logical one" signal from EXTEST 314 may select the output from the parallel boundary scan latch 2D5 to output to MUX 518. MUX 518 may receive inputs from MUX 510 and MUX 520. MUX 518 may select the output from MUX 510 based on a selection from an OR gate 522. The OR gate 522 may be selected from a repair 316, EXTEST 416, and AND gate 512. The AND gate 512 may couple to the inverted enable 312 from parallel boundary scan latch 4E5 and the inverted data 2D5. Although the AND gate 512 is shown receiving inverted inputs, the AND gate 512 with the inverted inputs is logically equivalent to a NOR gate. As long as the, EXTEST 314 is a logical one then the MUX 418 selects the parallel boundary scan latch 2D5. The MUX 518 may output the test signal to the driver 212, according to an embodiment.

In the normal mode, the gating logic 210 may be configured to connect the functional path 2F2 to the driver 212. The functional path 2F2 may couple to the MUX 510. The functional path 2F2 may be selected if the EXTEST 314 is a logical zero. Once selected, 2F2 may form an input to MUX 518. The functional path 2F2 may be selected if the repair 316 is a logical zero or if the enable and data are both a logical zero. The functional path may connect to the enable of the driver 212.

In the repair mode low, the IO cell 204 may receive an input from the cell above it, e.g., 2F1. The repair mode low is used to divert the functional path 2F1 through IO cell 204. Therefore, the functional path 2F1 may be received by the MUX 520. The MUX 520 may select the input based on a signal from the data 310 and enable 312. If data 310 is a logical one and enable 312 is a logical zero, then functional path 2F1 may be selected. The output of MUX 520 may be received by MUX 518. The MUX 518 may select functional path 2F1 based on the OR gate 522. The MUX 518 may select 2F1, if repair 316 is a logical one, EXTEST 314 is a logical zero, and data 310 is a logical one and enable 312 is a logical zero. After 2F1 is selected, then the 2F1 is connected to the driver 212.

In the repair mode high, the IO cell 204 may receive a functional path from the cell below, e.g., 2F3 from IO cell 206. The repair mode high is used to drive the functional path 2F3 through IO cell 204. The functional path 2F3 may be received by MUX 520. The MUX 520 may select 2F3 if either data 310 and enable 312 are a logical one, or if data 310 is a logical zero, and enable 312 is a logical one. The MUX 520 may couple to MUX 518. The MUX 518 may select functional path 2F3 if repair 316 is a logical one, EXTEST 314 is a logical zero, and either data 310 and enable 312 are a logical one, or if data 310 is a logical zero, and enable 312 is a logical one. The functional path 2F3 may connect to the driver 212 in the repair mode high.

Figure 6:
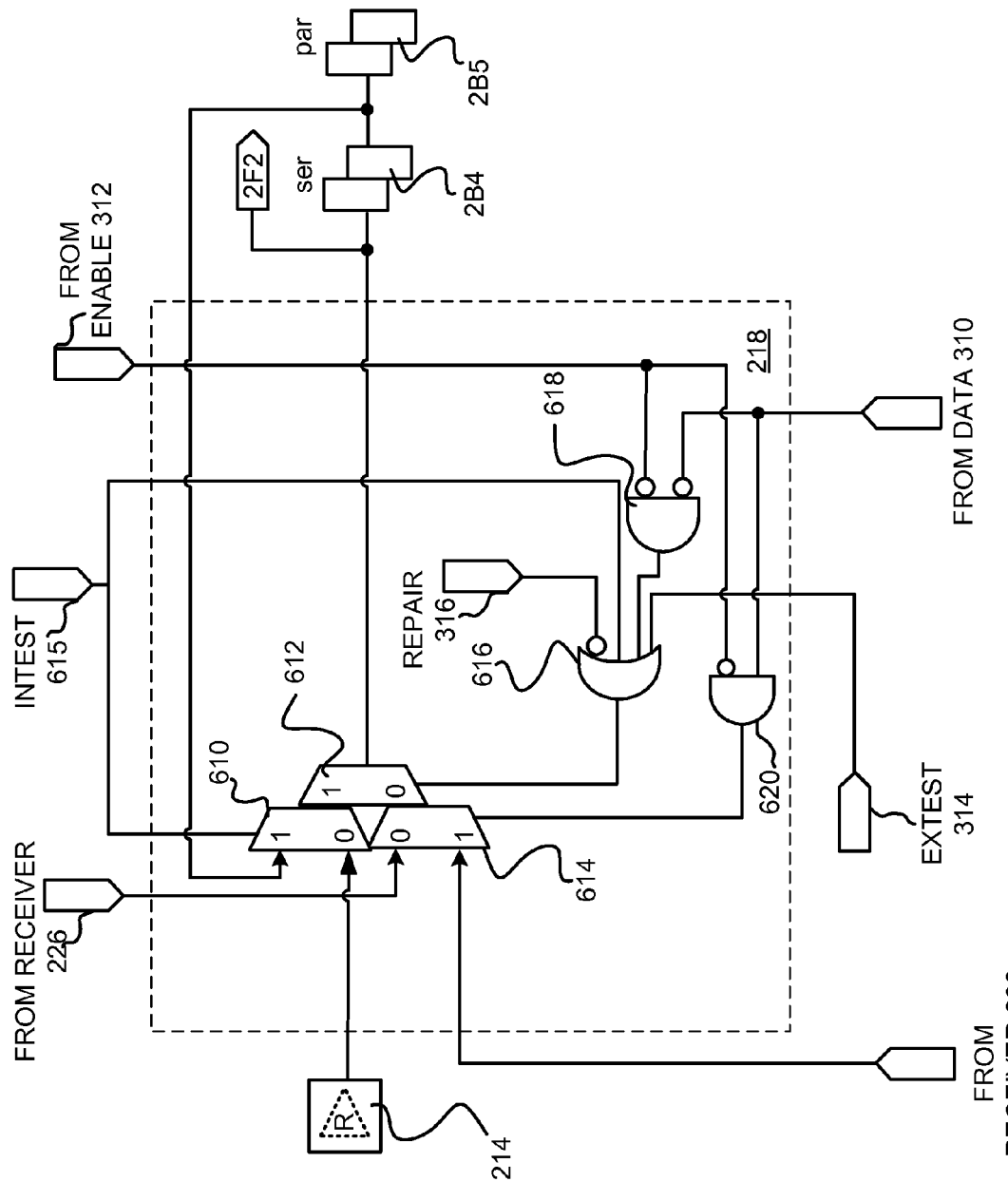
FIG. 6 illustrates a receiver switching logic for a rerouting device, according to various embodiments.

FIG. 6 illustrates a schematic diagram of the RSL 218 from IO cell 205, according to an embodiment. The RSL 218 is shown to illustrate selection of paths in repair modes. Other RSLs in other IO cells such as RSL 228 may be configured in a similar manner.

The RSL 218 may receive inputs from receiver 226 from receiving IO cell 203, receiver 236 from receiving IO cell 207, receiver 214, and the serial boundary scan latch 2B4. The RSL 218 may have three multiplexers: MUX 610, MUX 612, and MUX 614. MUX 610 may receive inputs from the serial boundary scan latch 2B4 at the first input and the receiver 214 at the second input. The MUX 610 may be selected by an INTEST 615 signal. The INTEST 615 signal may control the input for an internal testing input while EXTEST 314 is for an external testing input. The INTEST 615 and EXTEST 314 may be mutually exclusive, i.e., EXTEST 314 and INTEST 615 are not running at the same time. A logical one signal from INTEST 615 may select the serial boundary scan latch 2B4. The MUX 610 may output to MUX 612.

MUX 612 may receive the output from MUX 610 and MUX 614. MUX 612 may be selected by an OR gate 616 with a logical one signal selecting MUX 610. The OR gate 616 may receive an inverted repair signal 316. The OR gate 616 may receive an INTEST 615 signal and may receive an EXTEST signal 314. The OR gate 616 may also receive a signal from an AND gate 618. The AND gate may receive inverted inputs from the enable 312 and the data 310, according to an embodiment. In another embodiment, the AND gate 618 with inverted inputs may be a NOR gate without inverted inputs. The MUX 612 may output to both the functional path 2F2 and the serial boundary scan latch 2B4. The serial boundary scan latch 2B4 may couple with a parallel boundary scan latch 2B5. In another embodiment, the serial boundary scan latch 2B4 and parallel boundary scan latch 2B5 may be the same as 2D4 and 2D5, e.g., on a common IO.

MUX 614 may receive inputs from the receiver 226 at the third input and from the receiver 236 at the fourth input. MUX 614 may be selected by a signal from an AND gate 620. A logical one signal from the AND gate 620 may cause the MUX 614 to select the receiver 236 and a logical zero signal may select receiver 226. The AND gate 620 may receive an inverted signal from the enable 312 and signal from the data 310. The MUX 614 may be in an opposite configuration from the MUX 520 from FIG. 5, e.g., receiving data from the receiver 226 when a logical zero and from the receiver 236 when a logical one. This may be due to the RSL 218 selecting a third input, e.g., receiver 226, when DSL 210 is accepting a fourth input, e.g., 2F3, when the rerouting device 200 is in the repair mode high.

RSL 218 may select four modes, a testing mode, a normal mode, a repair mode low, and a repair mode high, according to an embodiment. In the testing mode, e.g., the internal testing mode, the test signal may be applied to the serial boundary scan latch 2B4. The serial boundary scan latch 2B4 may transmit the testing signal to one or more scan channels, according to an embodiment. The serial boundary scan latch 2B4 may transmit the testing signal to a MUX 610. The MUX 610 may receive inputs from the serial 2B4 and the receiver 214. The MUX 610 may be selected from a signal from INTEST 615. An "logical one" signal from INTEST 615 may select the output from the serial boundary scan latch 2B4 to output to MUX 518. Although the serial boundary scan latch 2B4 is shown receiving an input from MUX 612, the serial boundary scan latch 2B4 may also receive an input from any source such as a LBIST. Serial boundary scan latch 2B4 may be coupled to the output of MUX 612 with a logical one signal from the OR gate 616. The OR gate 616 may be selected from a repair 316, INTEST 615, EXTEST 314, and a NOR gate 618. The NOR gate 618 may couple to the enable 312 and the data 310. As long as the repair 316 is a logical zero or INTEST 615 or EXTEST 314 is a logical one, then the MUX 612 selects the serial boundary scan latch 2B4.

In a normal mode, which may also correspond to the EXTEST mode, the RSL 218 may be configured to couple the functional path 2F2 across the IO cell 203. The functional path 2F2 may be coupled to the receiver 214. The receiver may couple to the MUX 610. The functional path 2F2 may be selected if the INTEST 615 is a logical zero. Once selected, 2F2 may form an input to MUX 612. The functional path 2F2 to the functional path 2F2 output and may be selected and connected if the repair 316 is a logical zero, EXTEST (not shown) is a logical one, or if the enable and data are both a logical zero.

In a repair mode high, the RSL 218 may be configured to receive signals from a receiver above, below, or on the same IO cell, e.g., receiver 226, receiver 236, or receiver 214, respectively. In the repair mode high, the receiving IO cell 205 may receive an input from the cell above it, e.g., receiving IO cell 203. The repair mode high is used to divert the functional path 2F2 through IO cell 202 and the receiving IO cell 203. Therefore, the functional path 2F2 may be received by the receiver 226. The receiver 226 may couple to one input of the MUX 614. The MUX 614 may select an input based on a signal from the data 310 and enable 312. The MUX 614 may select 2F2 if either data 310 and enable 312 are a logical one, or if data 310 is a logical zero, and enable 312 is a logical one. The output of MUX 614 may be received by MUX 612. The MUX 612 may select functional path 2F2 based on the OR gate 616. The MUX 612 may select 2F2, if repair 316 is a logical one, INTEST 615 is a logical zero, and EXTEST 314 is a logical zero. After 2F2 is selected, then the receiver 226 is connected to the functional output 2F2.

In the repair mode low, the IO cell 204 may reroute a functional path 2F2 through the cell below, e.g., IO cell 206, and the receiving IO cell 207. The repair mode low is used to drive the functional path 2F2 through the receiving IO cell 207. The functional path 2F2 may be received by receiver 236. The MUX 614 may select the receiver 236 if data 310 is a logical one, and enable 312 is a logical zero. The MUX 614 may couple to MUX 612. The MUX 612 may select receiver 236 if repair 316 is a logical one, INTEST 615 is a logical zero, and EXTEST 314 is a logical zero. The functional path 2F2 may connect to the driver 212 in the repair mode high.

Figure 7:
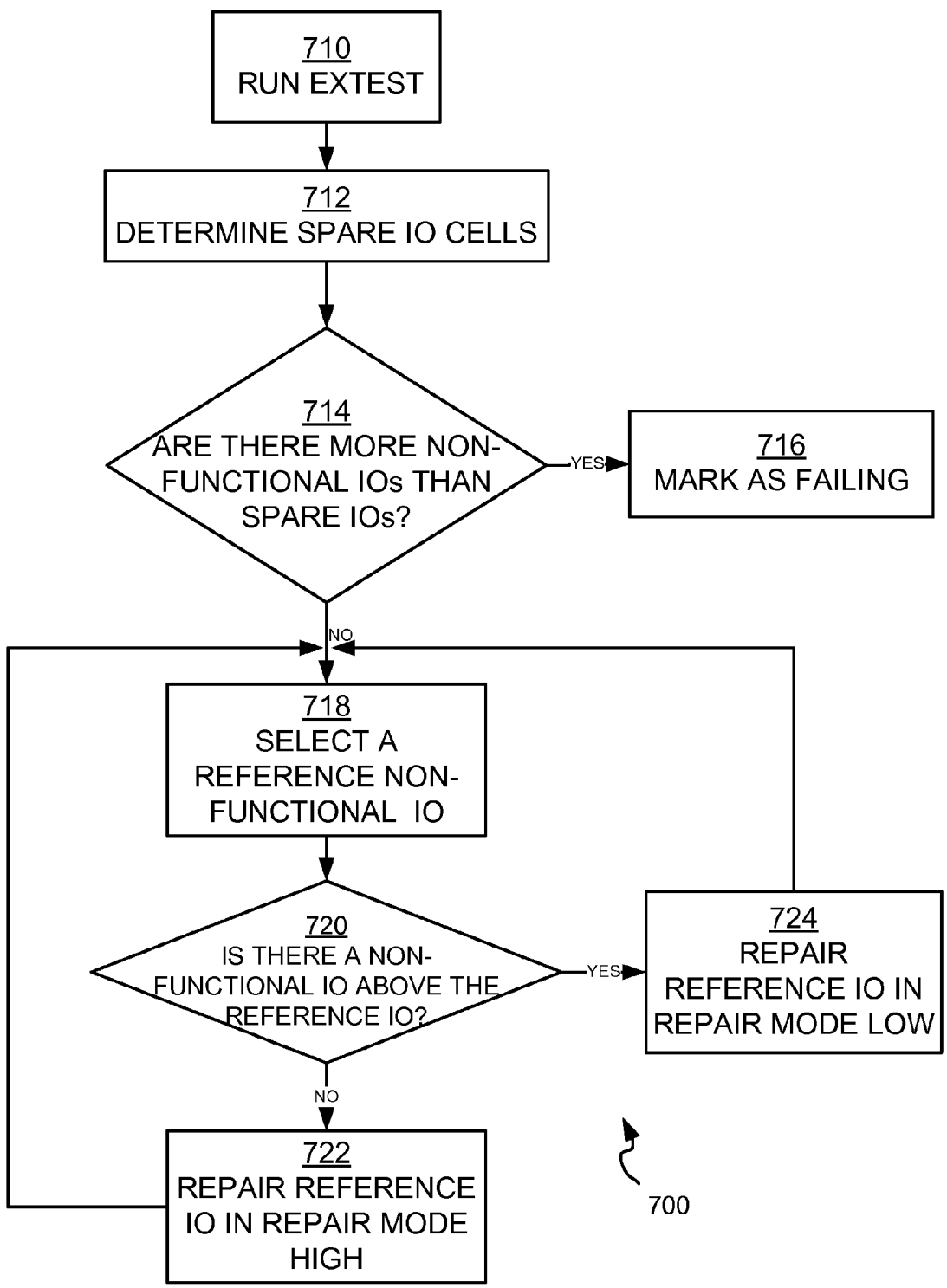
FIG. 7 illustrates a method for how non-functional IOs are repaired, according to various embodiments.

FIG. 7 illustrates a flow chart of a method 700 of determining which test mode to use on a rerouting device, according to an embodiment. In this exemplary method 700, the method 700 may apply to a dual-repair configuration with two or more non-functional IOs from an IO cell. Each IO cell may have one or more chips, e.g., a core that is linked to another core. The method 700 may begin at operation 710. In operation 710, an external tester may perform EXTEST and receive the test results. An IO may be identified as non-functional by a tester but the test may not know which logical elements are non-functional. After operation 710, the method 700 may proceed to operation 712. At operation 712, the tester may identify spare 10 cells in a rerouting device. In other embodiments, the tester may identify where the spare IO cells are in relation to the breaks, e.g., above or below the non-functional IO cell. The tester may also determine whether there are more non-functional IOs than there are spare IO cells in the rerouting device in operation 714.

If there are more non-functional IOs than spare IO cells, then the method 700 may proceed to operation 716. At operation 716, the tester may make the determination that an IO cannot be repaired and mark the chip card or board as failing and not useable without replacement. If there are fewer non-functional IOs than spare IOs, then it may be possible for the IO to be repaired and the method 700 proceeds to operation 718. In operation 718, the tester may select a non-functional IO to act as a reference. The selection may occur arbitrarily or based on a pattern, according to an embodiment. Once selected, the tester may determine whether there are any non-functional IOs above the reference IO in operation 720.

If there are not any non-functional IOs above the reference IO, then the tester may repair the reference IO using repair mode high in operation 722. In operation 722, the reference IO is rerouted through the IO cell above and so forth until a spare IO cell is reached. Once a spare IO cell is reached, the rerouting may stop and the analysis may continue in operation 718 by selecting another reference IO. If there are non-functional IOs above the reference IO, then the tester may repair the non-functional IO below the reference IO in repair mode low in operation 724. The method 700 may proceed to operation 718 where another non-functional IO is selected. In other embodiments, various placements of spare IO and arrangements of failing IOs may be accommodated.

Figure 8:
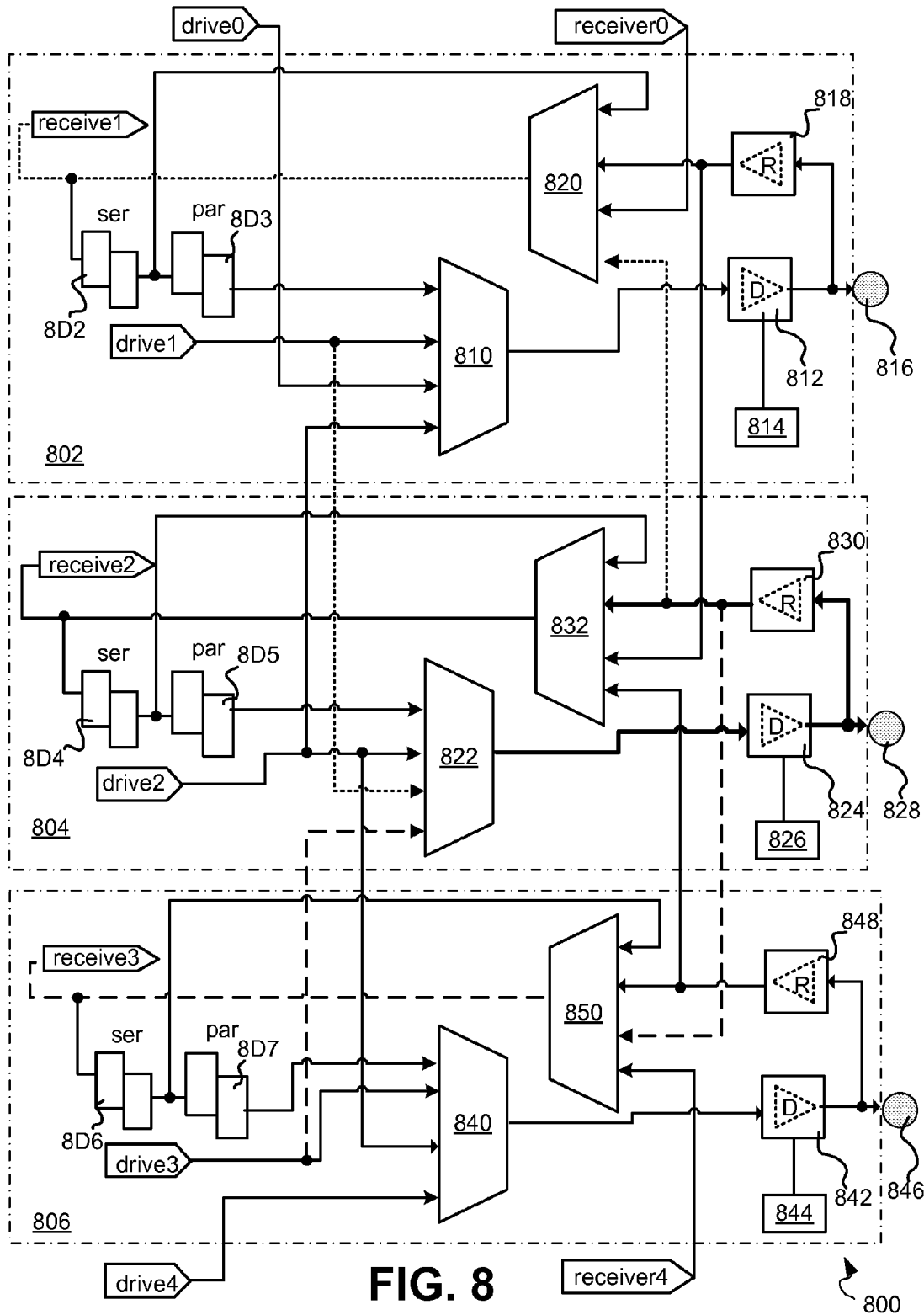
FIG. 8 illustrates a bi-directional configuration of a rerouting device, according to various embodiments.

FIG. 8 illustrates a schematic diagram of a rerouting device 800, according to an embodiment. The rerouting device 800 may have one or more IO cells on the same chip. In the shown embodiment, three IO cells are pictured: IO cell 802, IO cell 804, and IO cell 806. A difference between the rerouting device 800 and the rerouting device 200 on FIG. 2 is the bi-directional configuration. In the rerouting device 800, the IO cells have IOs that can be read from an external source. The rerouting device 800 may utilize one boundary scan serial and parallel, instead of two boundary scan latches. In one embodiment, a particular IO cell may represent one or more chips.

The concept of the rerouting device 800 is to allow the boundary scan latches from IEEE™ 1149.1 to transmit test patterns and using the boundary scan latches to provide a switching function for the repair of an IO cell. In rerouting device 800, an IO cell may operate in at least four different modes: a test mode, a normal mode, a repair mode high, and a repair mode low in a similar configuration to the rerouting device 200.

The IO cell 802 may have a driver switching logic (DSL) 810. The DSL 810 may be configured in the same manner as the DSL 210 in FIG. 5. DSL 810 may receive four inputs, a first input, a second input, a third input, and a fourth input. The first input may couple to a parallel boundary scan latch 8D3. The second input may couple to a functional path drive1. The third input may couple to a functional path drive0. The fourth input may couple to a functional path drive2 from IO cell 804. DSL 810 may couple to the driver 812. The DSL 810 may output one of the sources based on selector inputs (described further below) to a driver 812. The driver 812 may be enabled by enable 814. The driver 812 may output the source to an IO 816 and a receiver 818. A receiver switching logic (RSL) 820 may receive four inputs: a first input, a second input, a third input, and a fourth input. The first input may couple to the serial boundary scan latch 8D2. The second input may couple to the receiver 818. The third input may couple to receiver0, which may originate from an IO cell not shown. The fourth input may couple to receiver 830, which may originate from IO cell 804. The RSL 820 may select one of the inputs based on a selector (described further below) and output to recieve1. Receive1 may also input to serial boundary scan latch 8D2. The RSL 820 may be configured in a similar manner to RSL 218 from FIG. 2. For example, RSL 820 may receive input 8D2 instead of 2B4, receiver 818 instead of receiver 214, receiver0 instead of receiver 226, receiver 830 instead of receiver 236.

The IO cell 804 may have a DSL 822 that is configured in a similar manner to DSL 810. The DSL 822 may receive inputs from a serial boundary scan latch 8D4 and a parallel boundary scan latch 8D5 at a first input, a functional path drive2 at a second input, and alternate functional paths drive1 from IO cell 802 at a third input, and drive3 from IO cell 806 at a fourth input. The DSL 822 may output one of the sources based on selector inputs (described further below) to a driver 824. The driver 824 may be enabled by enable switching logic (ESL) 826. The ESL 826 may be configured in a similar manner to ESL 316 in FIG. 4. The ESL 826 may receive enable paths from ESL 814 and from ESL 844, according to an embodiment. The driver 824 may output the source to an IO 828 and a receiver 830. RSL 832 may receive inputs from the serial boundary scan latch 8D4 at a first input, the receiver 830 at a second input, and from alternate inputs receiver 818 at a third input and receiver 848 at a fourth input. The RSL 832 may select one of the inputs based on a selector (described below further) and output to recieve2. Receive2 may also input to serial boundary scan latch 8D4.

The IO cell 806 may have a DSL 840. DSL 840 may be configured in a similar manner to DSL 810. The DSL 840 may receive inputs from a serial boundary scan latch 8D6 and a parallel boundary scan latch 8D7 at a first input, a functional path drive3 at a second input, and alternate functional paths drive2 from IO cell 804 at a third input and drive4 from an IO cell (not shown) at a fourth input. The DSL 840 may output one of the sources based on selector inputs (described further below) to a driver 842. The driver 842 may be enabled by enable 844. The driver 842 may output the source to an IO 846 and a receiver 848. A RSL 850 may receive inputs from the serial boundary scan latch 8D6 at a first input, the receiver 848 at a second input, and from alternate inputs receiver 830 at a third input and a receiver4 from an unpictured IO cell at a fourth input. The RSL 850 may select one of the inputs based on a selector (described further) and output to receive3. Receive3 may also input to serial boundary scan latch 8D6.

In a test mode, the IO cells each receive a test signal from a scan latch. In this example, IO cell 802 may be used to illustrate the test mode. IO cell 802 may have a serial boundary scan latch 8D2 and a parallel boundary scan latch 8D3. The parallel boundary scan latch 8D3 may transmit the test signal to the DSL 810 at the first input. Control signals may be used to select the parallel boundary scan latch 8D3 and output to the driver 812. The driver 812 may be enabled by an enable 814. The enable 812 may be connected to other enables in the manner described in FIG. 4. The driver 812 may output the test signal to the IO 816. The driver 812 may output the test signal to the receiver 818. The receiver 818 may output the test signal to the receiver switching logic 820. The RSL 820 may be configured in a similar manner to the RSL 218 in FIG. 6. The RSL 820 may use gating signals from a data, enable, repair, and EXTEST to select the test signal at the first input. The test signal may proceed to receive1. The test mode may work in a similar manner for IO cells 804 and 806.

In the normal mode, the functional path, e.g., drive1, is driven by the driver, e.g., driver 812, and received by the receiver, e.g., receive 818. The receiver may transmit to the functional path, e.g., receive1. IO cell 802 will be used to illustrate the normal mode.

In the normal mode, the functional path drive 1 is received by the DSL 810 at the second input. The DSL 810 may select the functional path drive1 and output it to the driver 812. The enable 814 of the driver 812 may provide a logical one signal to the driver 812 so that the driver 812 may transmit the functional path drive1 to the receiver 818. The receiver 818 may couple with the RSL 820 at the second input. The RSL 820 may be configured to output the functional path drive1 to receive1. The normal mode may work in a similar manner for IO cells 804, and 806.

In the repair mode high, and repair mode low, an IO cell, e.g., 804, may be configured to receive a functional path from another IO cell, e.g., IO cell 802 or IO cell 806, and transmit the functional path through the driver and receiver. The receiver may transmit the received functional path back to an IO cell.

IO cell 804 may be used to illustrate both the repair mode high and the repair mode low. In the repair mode low, it is assumed that the IO 816 from IO cell 802 is non-functional. As a response, the functional path drive1 may couple to DSL 822 at the third input. The DSL 822 may select the functional path drive1 and couple the functional path drive1 to the driver 824. The enable 826 may be configured to receive the enable 814 and couple the enable 814 with the driver 824 in the repair mode low. The driver 824 may couple the functional path drive1 to the receiver 830. The receiver 830 may couple the functional path drive1 to the RSL 820 at the fourth input. The RSL 820 may be configured to select the functional path drive1 to couple to receive1.

In the repair mode high, it is assumed that the IO 846 from IO cell 806 is non-functional. As a response, the functional path drive3 may couple to DSL 822 at the fourth input. The DSL 822 may select the functional path drive3 and couple the functional path drive3 to the driver 824. The enable 826 may be configured to receive the enable 844 and couple the enable 844 with the driver 824 in the repair mode high. The driver 824 may couple the functional path drive3 to the receiver 830. The receiver may couple the functional path drive3 to the RSL 850 at the third input. The RSL 850 may be configured to select the functional path drive3 to couple to receive3.

In the shown embodiment, a particular IO cell may be diverted through the IO cell directly above or below it. In other embodiments, an IO cell may be diverted through any IO cell within the rerouting device. For example, drive1 from IO cell 802 may be diverted through IO cell 806. The rerouting of a particular IO cell may reroute one or more other IO cells. For example, if IO cell 802 has a bad IO 816 or a faulty connection between the driver 812 and receiver 818, and the functional path drive1 is routed through IO cell 804, then the functional path drive2 of IO cell 804 may be routed through IO cell 806. The shown rerouting device 800 may accommodate two IO fails but the rerouting device 800 may be configured to accommodate more than two IO fails, according to an embodiment.

Only one IO fail is shown at a time in the rerouting device 800. The rerouting device 800 may accommodate up to two IO fails. For example, if the IO cell 802 and IO cell 804 had failed to transmit between the driver, 812, 824, and receiver, 818,830, then both the repair mode high and the repair mode low may be used. The repair mode high may be used by routing the functional path drive1 through the IO cell above it (not pictured) and may cascade until a spare IO cell is reached. Simultaneously, the repair mode low may be used by routing the functional path drive2 through IO cell 806. The functional path drive3 may be further routed to the IO cell below IO cell 806 (not pictured), and so forth, until a spare IO cell is reached. In the shown configuration, there may be at least two spare IO cells in the rerouting device 800, but other configurations are contemplated.

Figure 9:
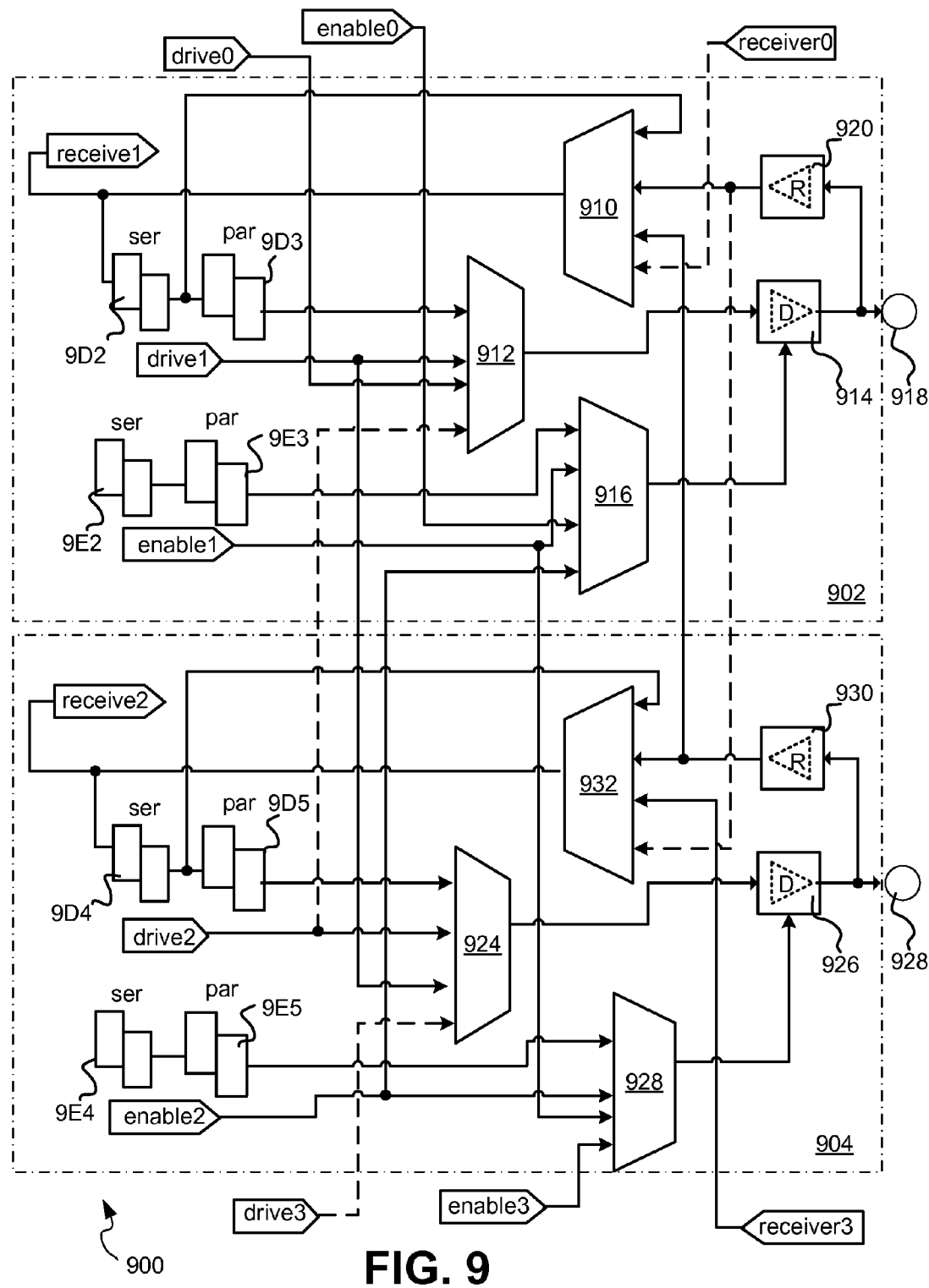
FIG. 9 illustrates a bi-directional configuration of a rerouting device with part of the enable switching logic shown, according to various embodiments.

FIG. 9 illustrates a circuit diagram of a rerouting device 900 that may force a driver to tri-state, according to an embodiment. An aspect of the rerouting device 900 is that a driver may be forced into a tri-state mode which may reduce any errors associated with a short circuited path. The rerouting device 900 may have two or more IO cells. IO cell 902 and IO cell 904 are shown with at least an IO cell above IO cell 902 and IO cells below IO cell 904.

The rerouting device 900 may have two embodiments. In a first embodiment, referred to as a single repair configuration, the rerouting device 900 may repair one non-functional IO through either an IO cell above or below it but not both until a spare IO cell is reached. In a second embodiment, referred to as a dual-repair configuration, the rerouting device 900 may repair two or more non-functional IOs through both an IO cell above the non-functional IO and an IO cell below the non-functional IO until a spare IO cell is reached.

IO cell 902 may contain a serial boundary scan latch 9D2 and a parallel boundary scan latch 9D3. The serial boundary scan latch 9D2 may couple to a first input for a receiver switching logic (RSL) 910 and the parallel boundary scan latch 9D3. The parallel boundary scan latch 9D3 may couple to the first input of a driver switching logic (DSL) 912. The DSL 912 may receive a second input from a functional path drive1, a third input from a functional path drive0 from an IO cell not shown, and an optional fourth input from functional path drive2 from IO cell 904. For the dual-repair configuration, the DSL 912 may be configured in a similar manner to the DSL 210 in FIG. 5. The DSL 912 for the single-repair configuration is described more fully on FIG. 10.

The DSL 912 may select one of the inputs to couple to the driver 914. The driver 914. The driver 914 may be enabled by an enable signal through an enable switching logic (ESL) 916. The ESL 916 may receive inputs to couple to the enable of the driver 914. A serial boundary scan latch 9E2 may couple to a parallel boundary scan latch 9E3. The parallel boundary scan latch 9E3 may couple to a first input of the ESL 916. A functional path enable1 may couple to a second input of the ESL 916. A functional path enable0 from an IO cell not shown may couple to a third input of the ESL 916. A functional path enable2 from IO cell 904 may optionally couple to the fourth input of the ESL 916. If the output of the ESL 916 is a one, then the driver 914 is enabled. If the output of the ESL 916 is a zero, then the driver 914 may be in a tri-state configuration. In the single-repair configuration, the ESL 916 may be configured in a similar manner to the ESL 216 in FIG. 4. Instead of a fourth input receiving an enable path from another ESL, e.g., ESL 234, the ESL 916 may receive a enable signal of a logical zero which may be selected in a similar manner. When the IO 918 is non-functional, a logical zero signal may be selected by the tester and received by the driver 914. In some embodiments, when the logical zero signal is received by the driver 914, the driver 914 may initiate a tri-state mode.

The tri-state mode may apply only to the driver 914 and may effectively deactivate the driver 914. The tri-state mode may float the driver, instead of outputting either a logical one or a logical zero signal. Floating the input may prevent issues with crossed wires causing a short circuit on IO cell 902. In the tri-state configuration, the driver 914 may not receive any current. In the dual-repair configuration, the ESL 916 may incorporate a fifth input described further in FIG. 12.

The driver 914 may couple to an IO 918 and a receiver 920. The receiver 920 may couple to a second input to RSL 910. The RSL 910 may receive a first input from the serial boundary scan latch 9D2, an optional fourth input from receiver0 from an IO cell not shown, and an third input from receiver 930. The RSL 910 may couple to receive1 which may further couple to serial boundary scan latch 9D2. For the dual-repair configuration, the RSL 910 may be configured in a similar manner to the RSL 218 in FIG. 6. The RSL 910 for the single-repair configuration is described more fully on FIG. 11.

IO cell 904 may contain a serial boundary scan latch 9D4 and a parallel boundary scan latch 9D5. The serial boundary scan latch 9D4 may couple to a first input for a receiver switching logic (RSL) 932 and the parallel boundary scan latch 9D5. The parallel boundary scan latch 9D5 may couple to the first input of a driver switching logic (DSL) 924. The DSL 924 may receive a second input from a functional path drive2, a third input from a functional path drive1 from IO cell 902, and an optional fourth input from functional path drive3 from an IO cell not shown.

The DSL 924 may select one of the inputs to couple to the driver 926. The driver 926. The driver 926 may be enabled by an enable signal through an enable switching logic (ESL) 928. The ESL 928 may receive inputs to couple to the enable of the driver 926. A serial boundary scan latch 9E4 may couple to a parallel boundary scan latch 9E5. The parallel boundary scan latch 9E4 may couple to a first input of the ESL 928. A functional path enable2 may couple to a second input of the ESL 928. A functional path enable1 from IO cell 902 may couple to a third input of the ESL 928. A functional path enable3 from an IO cell not shown may optionally couple to the fourth input of the ESL 928. If the output of the ESL 928 is a logical one, then the driver 926 is enabled. If the output of the ESL 928 is a logical zero, then the driver 926 may be in a tri-state configuration. In the tri-state configuration, the driver 926 does not receive any current. The driver 926 may couple to an IO 928 and a receiver 930. The receiver 930 may couple to a second input to RSL 932. The RSL 932 may receive a first input from the serial boundary scan latch 9D4, an optional fourth input from receiver 920 from IO cell 902, and a third input from receiver3 from an IO cell not shown. The RSL 932 may couple to receive2 which may further couple to the input of serial boundary scan latch 9D4.

The rerouting device 900 may have three or four modes: a test mode, a normal mode, and a repair mode, which may further include a repair mode high and a repair mode low.

In the test mode, the rerouting device 900 may work in a similar manner to the embodiment on FIG. 8. To illustrate the concept, IO cell 902 may be used. IO cell 904 may operate in a similar fashion. In the test mode, the parallel boundary scan latch 9D3 may couple to the DSL 912. The DSL 912 may select the first input and couple to the driver 914. The driver 914 may couple to the first input of the ESL 916. The first input of the ESL 916 is coupled to the parallel boundary scan latch 9E3 which is further coupled to the serial boundary scan latch 9E2 scan latch. The driver 914 may output to both the IO 918 where it can be read from an external source. The RSL 910 may receive the output of the serial boundary scan latch 9D2 and the testing signal applied and selected to proceed to receive1.

In the normal mode, functional path drive1 is coupled to the functional path recieve1 through the driver 914 and receiver 920 of the rerouting device 900. The driver 914 is enabled by enable1. Drive1 may couple to the second input of DSL 912. The DSL 912 may select the second input to couple with the driver 914. The driver 914 may couple to the receiver 920. The receiver 920 may couple to the second input on the RSL 910 which may further couple to the functional path recieve1. The receiver 920 may be selected by the RSL 910 to output to the functional path receive1.

In an embodiment, both the single-repair configuration and the dual-repair configuration rerouting device 900 may have a repair mode low. In the single-repair configuration, the fourth input to the DSL, e.g., 912, and the RSL, e.g., 910, may not be present. After EXTEST, the tester may determine that IO 918 is non-functional. In the repair mode low, the functional path drive1 may be routed through IO cell 904 to receive1, according to an embodiment. The drive1 may form the third input of DSL 924. The DSL 924 may select the third input to couple to the driver 926. The driver 926 may be enabled by ESL 928. The ESL 928 may be configured to select the enable path enable1 from the third input of ESL 928 to couple with the driver 926. The driver 926 may couple with the receiver 930 which may further form the third input of the RSL 910. The RSL 910 may be configured to select the input from receiver 930 to couple with the functional path receive1.

The fourth input to DSL 912, and RSL 910 of IO cell 902, shown as a dotted line, may be an optional dual repair configuration similar to in FIG. 8 (discussed below). IO cell 904 may be configured in a similar manner to IO cell 902. Therefore, the repair mode high may only apply when the fourth input is used.

In the repair mode high, the IO 928 may be non-functional. The functional path drive2 is diverted through IO cell 902 to receive2. The functional path drive2 may be received by DSL 912. The DSL 912 may be configured to select drive2 to couple with the driver 914. The driver 914 may be configured to be enabled by ESL 916, which may be configured to select the fourth input from enable2. The driver 914 may couple with receiver 920. The receiver 920 may couple with the fourth input of RSL 932. RSL 932 may be configured to select the receiver 920 to couple with the functional path receive2.

The dual-repair configuration of the rerouting device 900 may have five repair states: none, repair mode high, repair mode low, repair mode high—with tri-state, and repair mode low—with tri-state. In order to create more decodes than only parallel latches, the serial scan latches may be used in addition to the parallel latches. Adding the serial and parallel enable sixteen decodes which allows for a large MUX correction for up to fifteen errors without the tri-state option or seven errors with the tri-state option.

Figure 10:
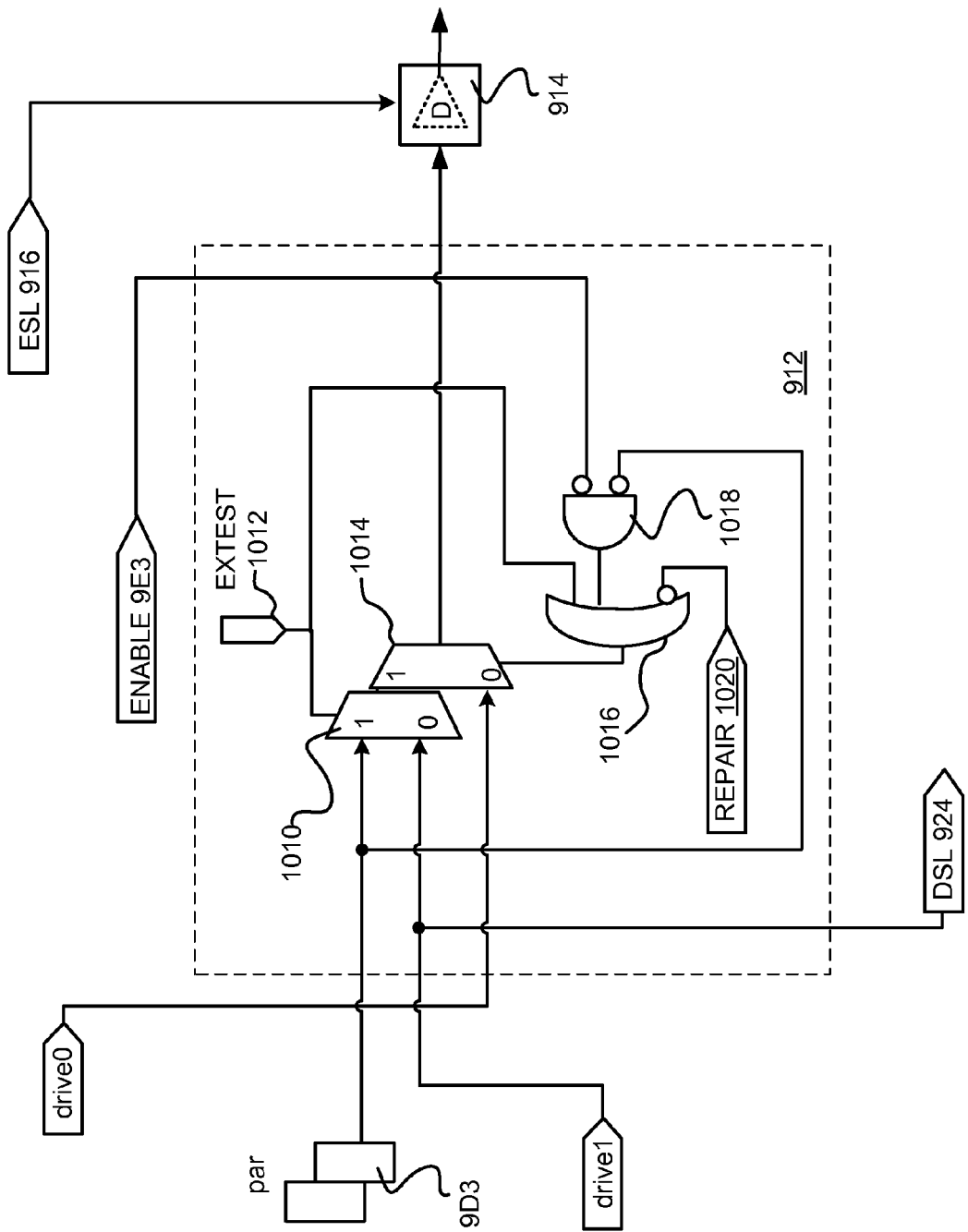
FIG. 10 illustrates a driver switching logic that can handle one repair and tri-state a driver, according to various embodiments.

FIG. 10 illustrates a circuit diagram of the DSL 912 in a single-repair configuration that allows shorting of the driver 914, according to an embodiment. In the shown example, the rerouting device 900 allows for the repair of a single non-functional IO.

DSL 912 may have a MUX 1010 that receives two inputs, the first input from parallel boundary scan latch 9D3 and the second input from functional path drive1. The MUX 1010 may be selected by a signal from EXTEST 1012 with a logical one signal from EXTEST 1012 selecting the parallel boundary scan latch 9D3. The MUX 1010 may output to MUX 1014. MUX 1014 may receive the input from MUX 1010 and have the third input from drive0. In the shown embodiment, the DSL 912 does not accept a fourth input. The MUX 1014 may be selected by an OR gate 1016. The OR gate 1016 may receive inputs containing EXTEST 1012, an AND gate 1018, and an inverted repair 1020. The MUX 1014 may select the input from MUX 1010 with a logical one signal from the OR gate 1016. The MUX 1014 may select the input from the third input from drive0 with a logical zero signal from the OR gate 1016. The OR gate may be a logical zero if the repair 1020 is a logical one, the EXTEST 1012, and the AND gate 1018 is a logical zero. The AND gate 1018 may be a logical zero if both the enable signal from 9E3 and the data signal from 9D3 is a logical one. The MUX 1014 may output to the driver 914.

Figure 11:
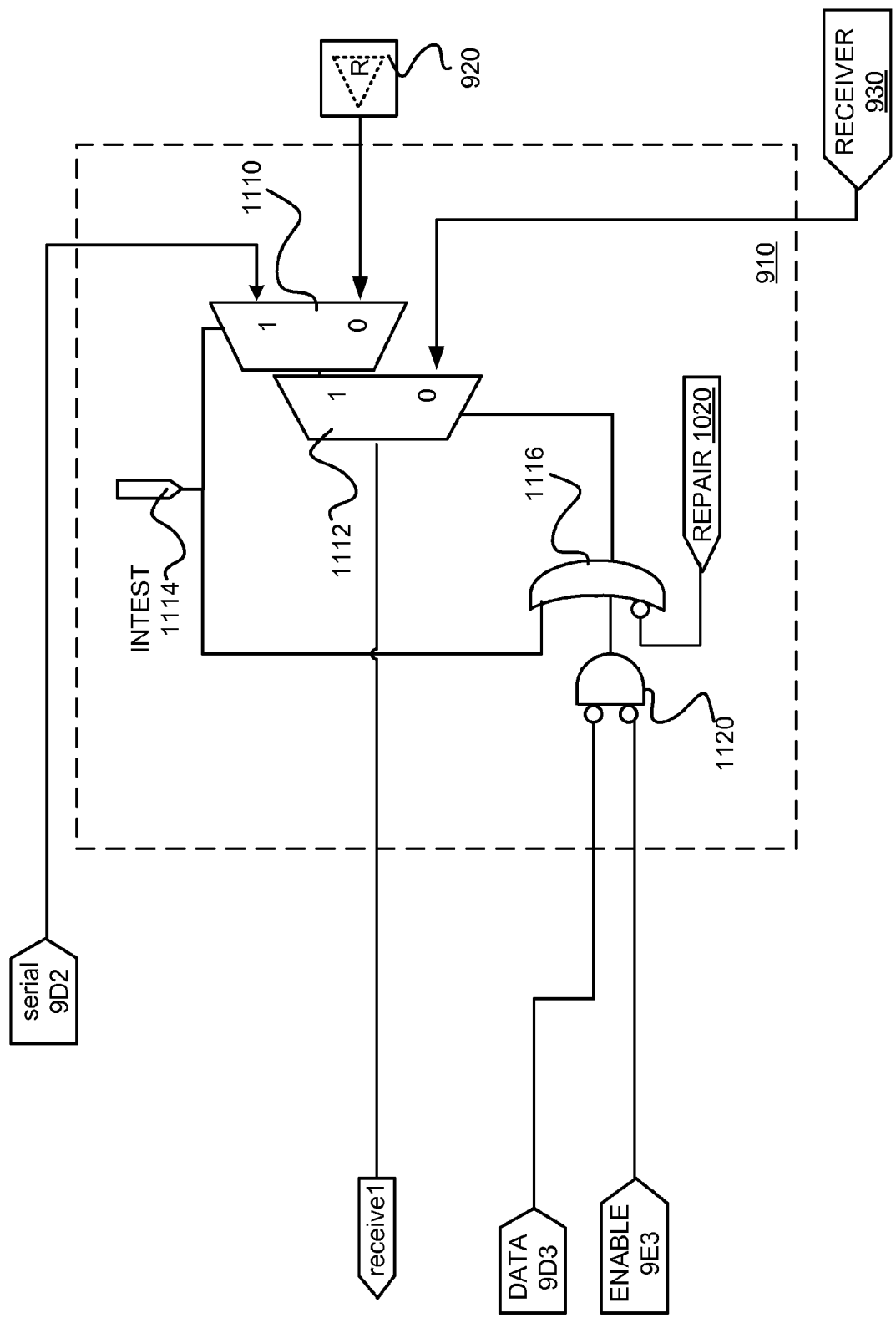
FIG. 11 illustrates a receiver switching logic that can handle one repair and tri-state a driver, according to various embodiments.

FIG. 11 illustrates a circuit diagram of the RSL 910 in a single repair configuration, according to an embodiment. The RSL 910 may have a MUX 1110. The MUX 1110 may have the first input coupled to serial boundary scan latch 9D2 and the second input coupled to the receiver 920. The MUX 1110 may be selected by an INTEST signal 1114. A logical one signal from the INTEST 1114 may select the serial boundary scan latch 9D2 in a test mode. A logical zero signal from the INTEST 1114 may select the receiver 920. The MUX 1110 output may further couple to MUX 1112. The MUX 1112 may receive the output to the MUX 1110 and the third input from receiver 930. The MUX 1112 may be selected by an OR gate 1116. The OR gate 1116 may output a logical one or a logical zero signal. If the OR gate 1116 produces a logical one signal, then the output of the MUX 1110 is selected. If the OR gate 1116 produces a logical zero signal, then the third input is selected. The OR gate 1116 may receive inputs from INTEST 1114, an inverted repair 1020, and an AND gate 1120. The AND gate 1120 may receive inverted inputs from data 9D3 and enable 9E3, according to an embodiment. If INTEST 1114 is a logical zero, Data 9D3 and enable 9E3 are a logical zero, and repair 1020 is a logical one, then the third input from receiver 930 may be selected by MUX 1112. The MUX 1112 may output to the functional path receive1.

Figure 12:
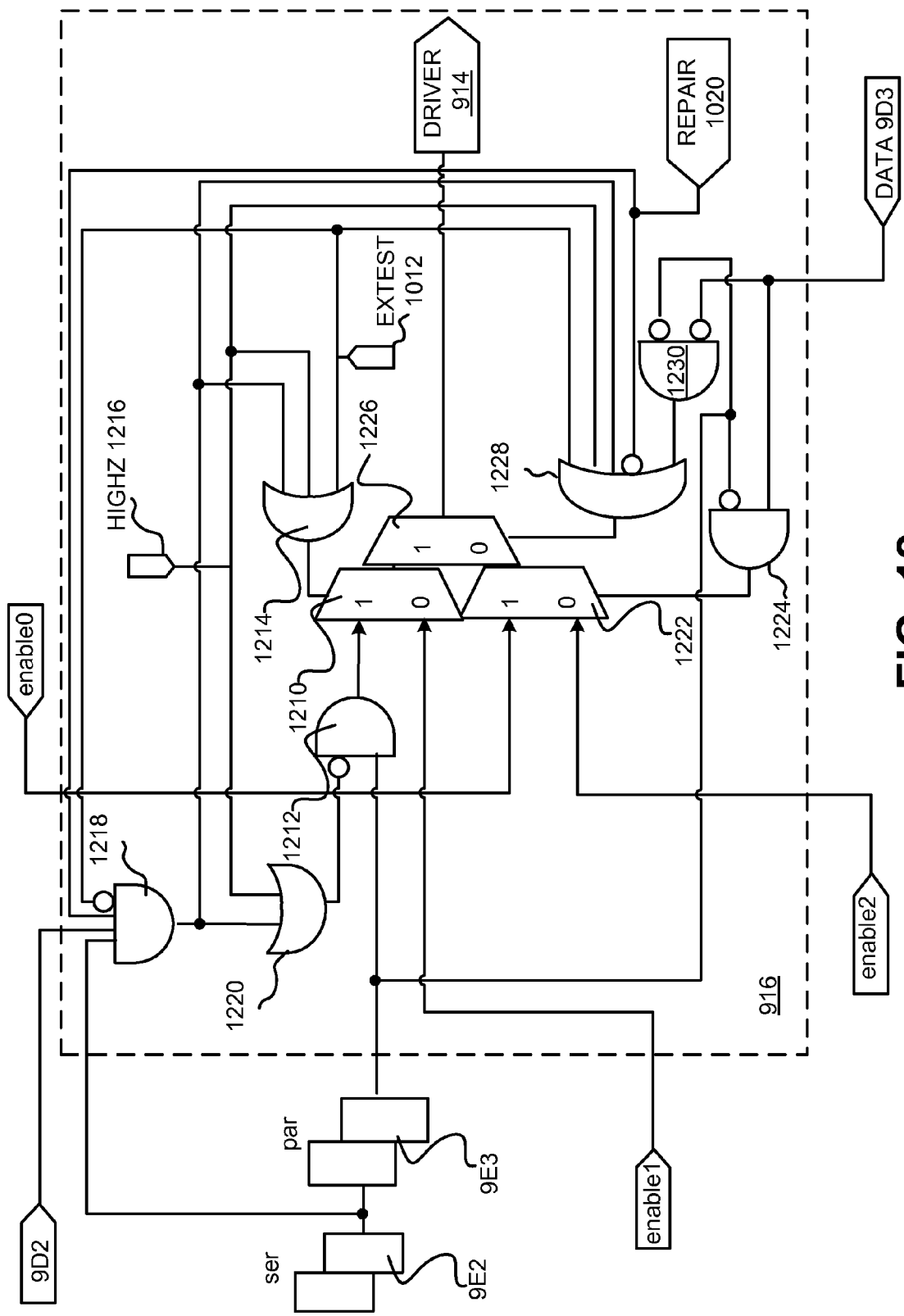
FIG. 12 illustrates an enable switching logic that can handle one or more repairs and tri-state a driver, according to various embodiments.

FIG. 12 illustrates a circuit diagram of the ESL 916 from FIG. 9, according to an embodiment. The ESL 916 may be configured to accept five inputs. The fifth input may cause the driver 914 to tri-state as described in FIG. 9. The tri-state of the driver 914 may also be referred to as a fifth mode. The ESL 916, may have a MUX 1210 that receives a first input from an AND gate 1212 and a second input from the enable path enable1. The first input of the MUX 1210 may be selected by a logical one signal from an OR gate 1214. The OR gate 1214 may receive inputs from HIGHZ 1216, EXTEST 1012, and an AND gate 1218. The HIGHZ 1216 is the IEEE™ 1149.1 standard signal that activates the tri-state, according to an embodiment. The AND gate 1212 may further couple to an inverted signal from an OR gate 1220 and the parallel 9E3. The parallel boundary scan latch 9E3 may couple to the serial boundary scan latch 9E2. The OR gate 1220 may receive inputs from both HIGHZ 1216 and from the AND gate 1218. AND 1218 may receive inputs from the serial 9E2 forming the serial enable, and the serial boundary scan latch 9D2 forming the serial data. The AND gate 1218 may also receive inputs from the inverted EXTEST 1012 and the repair 1020.

The ESL 916 may have a MUX 1222 that receives the third input from enable path enable0 and the fourth input from enable path enable2. MUX 1222 may select the third input with a logical one signal from an AND gate 1224. The AND gate 1224 may receive an inverted input from the enable 9E3 and an input from the data 9D3. MUX 1226 may receive inputs from MUX 1222 and MUX 1210. MUX 1226 may be selected by an OR gate 1228. The OR gate 1228 may receive an inverted input from the repair 1020, and inputs from EXTEST 1012, HIGHZ 1216, AND gate 1218, and AND gate 1230. AND gate 1230 may receive inverted inputs from data 9D3 and enable 9E3. The MUX 1226 may output either a logical one or a logical zero signal to the driver 914. The specific gating signals of ESL 916 may be further described in FIG. 13.

Figure 13:
FIG. 13 illustrates a table that corresponds to the gating signals for the enable switching logic of FIG. 12, according to various embodiments.

FIG. 13 illustrates a table of the ESL gating signals 1300 of the embodiment shown in FIG. 12, according to an embodiment. The ESL gating signals 1300 may be an example of how selected modes are triggered.

While the Detailed Description may refer to specific types of transistors, logic gates, supply voltages, and the like it will be appreciated that one skilled in the art may implement the same or similar functions using different transistors, logic gates, and supply voltages in alternative aspects as described and still accomplish the same purpose of the invention. For example, transistors may be PFETs or NFETs. Logic gates may be AND, OR, XOR, NOR, NAND, XNOR or inverters. Therefore, the scope of the invention should not be limited.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope and spirit of the disclosed subject matter.

What is claimed is:

1. A method, comprising:
receiving EXTEST results that describe a plurality of IO (Input-Output) cells, with each IO cell having a driver and receiver, the plurality of IO cells including a first IO cell, a second IO cell, and a third IO cell with the first IO cell being adjacent to the second IO cell and the second IO cell being adjacent to the third IO cell, wherein the EXTEST is a signal that initiates a test mode from a IEEE™ 1149.1 boundary scan latch, an IO cell has a driver and a receiver using a chip-to-chip interconnect;
identifying one or more spare IO cells from the plurality of IO cells, a spare IO cell allows a functional path to be routed through the spare IO cell without requiring any routing;
determining whether there are more non-functional IOs than spare IO cells, wherein the driver does not transmit to the receiver via the chip-to-chip interconnect in a non-functional IO cell;
marking, in response to there being a greater number of non-functional IO cells than spare IO cells, the plurality of IO cells as failing;
determining that the second IO is a non-functional IO cell and the third IO is a spare IO cell in response to there being a greater number of spare IO cells than non-functional IO cells;
determining whether the second IO cell can be routed through the third IO cell;
routing, in response to determining that the second IO cell can be routed through the third IO cell, the second IO cell through the third IO cell using the IEEE™ 1149.1 boundary scan latch to select the second IO cell on a multiplexer on the third IO cell;
determining, in response to determining that the second IO cell can not be routed through the third IO cell, whether the second IO cell can be routed through the first IO cell; and
routing, in response to determining that the second IO cell can be routed through the first IO cell, the second IO cell through the first IO cell using the IEEE™ 1149.1 boundary scan latch to select the second IO cell on a multiplexer on the first IO cell.

2. The method of claim 1, wherein using the IEEE™ 1149.1 boundary scan latch includes using at least a boundary scan serial and a boundary scan parallel.

3. The method of claim 1, further comprising:
routing, in response to determining that the second IO cell can be routed through the third IO cell, the third IO cell through a fourth IO cell using the IEEE™ 1149.1 boundary scan latch to select the second IO cell on a multiplexer on the fourth IO cell.

4. A system for using the IEEE™ 1149.1 boundary scan latch to repair a non-functional IO, comprising:
a IEEE™ 1149.1 boundary scan serial latch;
a IEEE™ 1149.1 boundary scan parallel latch;
a driver for a chip-to-chip interconnect that is controlled by an enable signal;
the enable switching logic that is configured to select from the IEEE™ 1149.1 boundary scan parallel latch, a first enable, a second enable, and a third enable to connect with the driver based on the input from the IEEE™ 1149.1 boundary scan parallel latch, the enable switching logic selects a third enable from to connect with the driver in response to the IEEE™ 1149.1 boundary scan parallel latch being on and selects the first enable in response to the IEEE™ 1149.1 boundary scan parallel latch being off.

5. The system of claim 4, wherein the enable switching logic also has a tristate repair mode that is activated based on the IEEE™ 1149.1 boundary scan serial latch.

6. The system of claim 4, wherein, the first enable, the second enable, and the third enable each provide a different enable signal.

* * * * *